US012787631B2

(12) United States Patent
Choi

(10) Patent No.: US 12,787,631 B2
(45) Date of Patent: Nov. 3, 2026

(54) DISPLAY DEVICE INCLUDING PARTIAL CIRCUITS

(71) Applicant: Samsung Display Co., Ltd., Yongin-si (KR)

(72) Inventor: Jonghyun Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 529 days.

(21) Appl. No.: 18/447,735

(22) Filed: Aug. 10, 2023

(65) Prior Publication Data

US 2024/0155934 A1 May 9, 2024

(30) Foreign Application Priority Data

Nov. 8, 2022 (KR) ........................ 10-2022-0147834

(51) Int. Cl.

| | |
|---|---|
| ***H10K 77/10*** | (2023.01) |
| ***H10K 59/131*** | (2023.01) |
| ***H10K 59/88*** | (2023.01) |
| ***H10K 102/00*** | (2023.01) |

(52) U.S. Cl.

CPC ......... *H10K 77/111* (2023.02); *H10K 59/131* (2023.02); *H10K 59/88* (2023.02); *H10K 2102/311* (2023.02)

(58) Field of Classification Search

CPC .... H10K 77/111; H10K 59/131; H10K 59/88; H10K 2102/311; H10K 59/1213; H10K 59/873; H10K 50/844; H10K 59/1216; G09F 9/301; G09F 9/33; G09F 9/335; G09G 3/30; G09G 3/3233; G06F 1/1616; H04M 1/0216

See application file for complete search history.

(56) References Cited

U.S. PATENT DOCUMENTS

| | | | | |
|---|---|---|---|---|
| 10,411,204 | B2 * | 9/2019 | Li | H10K 59/131 |
| 10,803,283 | B2 * | 10/2020 | Han | H10K 59/60 |
| 12,446,417 | B2 | 10/2025 | Park et al. | |
| 2018/0293936 | A1 * | 10/2018 | Fujioka | H10K 59/1213 |
| 2019/0278145 | A1 | 9/2019 | Tanaka et al. | |
| 2020/0119113 | A1 * | 4/2020 | Lee | H10K 50/11 |
| 2020/0209670 | A1 * | 7/2020 | Matsunaga | G02F 1/133305 |
| 2021/0407344 | A1 * | 12/2021 | Lee | H10K 59/878 |

(Continued)

FOREIGN PATENT DOCUMENTS

KR 10-2022-0133362 A 10/2022

*Primary Examiner* — J. E. Schoenholtz

(74) *Attorney, Agent, or Firm* — Innovation Counsel LLP

(57) ABSTRACT

A display device includes a support plate including a first area and a second area changed depending on a switch of an operation mode, and a display panel including first and second display areas respectively overlapping first and second areas. The second display area includes a first partial area including a pixel circuit of a first group, a pixel circuit of a second group, and a first light emitting device electrically connected to the pixel circuit of the first group or the pixel circuit of the second group, and second partial areas each including a second light emitting device electrically connected to the pixel circuit of the first group or the pixel circuit of the second group. The pixel circuit of the second group includes a first partial circuit and a second partial circuit, with a corresponding second partial area among the second partial areas therebetween.

20 Claims, 20 Drawing Sheets

(56) References Cited

U.S. PATENT DOCUMENTS

| | | | | |
|---|---|---|---|---|
| 2022/0005385 | A1* | 1/2022 | Feng | G09F 9/301 |
| 2023/0200153 | A1* | 6/2023 | Choi | H10K 77/111 257/40 |

* cited by examiner

PC2-1

DISPLAY DEVICE INCLUDING PARTIAL CIRCUITS

CROSS-REFERENCE TO RELATED APPLICATIONS

This application claims priority to and benefits of Korean Patent Application No. 10-2022-0147834 under 35 U.S.C. § 119 filed on Nov. 8, 2022, in the Korean Intellectual Property Office, the entire contents of which are incorporated herein by reference.

BACKGROUND

1. Technical Field

Embodiments described herein relate to a display device, and, relate to a display device in which one pixel circuit may include partial circuits spaced from each other.

2. Description of the Related Art

Electronic devices such as a smartphone, a tablet, a notebook computer, an automotive navigation system, and a smart television are being developed. The electronic devices include a display device to provide information.

Various types of display devices are being developed to satisfy the user experience (UX)/user interface (UI) of a user. Among the display devices, a flexible display is being actively developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device with an improved impact resistance characteristic.

According to an embodiment, a display device may include a support plate that may include a first area and a second area; and a display panel that may include a first display area overlapping the first area and a second display area overlapping the second area, the second area includes openings and a support area adjacent to the openings, a shape of the second area changes as an operation mode switches. The second display area may include a first partial area that may include a pixel circuit of a first group, a pixel circuit of a second group, and a first light emitting device electrically connected to the pixel circuit of the first group or the pixel circuit of the second group and overlapping the support area in plan view, and second partial areas, each of which may include a second light emitting device electrically connected to the pixel circuit of the first group or the pixel circuit of the second group and respectively overlapping the openings in plan view. The pixel circuit of the second group may include a first partial circuit and a second partial circuit, and corresponding second partial area among the second partial areas is disposed between the first partial circuit and the second partial circuit.

The first area may provide a substantially flat support surface.

A resolution of the first light emitting device may be substantially identical to a resolution of the second light emitting device.

The first display area may include a third light emitting device, and a resolution of a light emitting device of the first display area may be substantially identical to a resolution of a light emitting device of the second display area.

The resolution of the light emitting device of the first display area and the resolution of the light emitting device of the second display area may be less than a resolution of a pixel circuit of the first partial area.

The first display area may include a third light emitting device and a pixel circuit of a third group electrically connected to the third light emitting device, and a resolution of a pixel circuit of the first display area may be less than a resolution of a pixel circuit of the first partial area of the second display area.

The first area may include first areas, and the second area may be disposed between two first areas adjacent to each other from among the first areas.

The pixel circuit of the second group may include a first transistor, a second transistor, a third transistor, a fourth transistor, a fifth transistor, a sixth transistor, and a seventh transistor and a capacitor, and contact holes may be defined in the display panel to correspond to the first transistor, the second transistor, the third transistor, the fourth transistor, the fifth transistor, the sixth transistor, and the seventh transistor.

At least some of the first transistor, the second transistor, the third transistor, the fourth transistor, the fifth transistor, the sixth transistor, and the seventh transistor and at least some of the contact holes may be disposed in the first partial circuit, and remaining transistors of the first transistor, the second transistor, the third transistor, the fourth transistor, the fifth transistor, the sixth transistor, and the seventh transistor and remaining contact holes of the contact holes may be disposed in the second partial circuit.

First dummy contact holes corresponding to locations of the remaining contact holes of the contact holes may be defined in the second partial area adjacent to the first partial circuit.

Second dummy contact holes corresponding to locations of the some of the contact holes may be defined in the second partial area adjacent to the second partial circuit.

The support area may be in a substantially lattice shape.

The pixel circuit of the second group may include pixel circuits, and the pixel circuits may include a (2-1)-th pixel circuit electrically connected to a corresponding light emitting device among the first light emitting device and the second light emitting device, and a (2-2)-th pixel circuit electrically connected to a corresponding light emitting device among the first light emitting device and the second light emitting device.

The first partial circuit and the second partial circuit may be spaced from each other in a first direction, with the corresponding second partial area disposed between the first partial circuit and the second partial circuit, and the (2-1)-th pixel circuit and the (2-2)-th pixel circuit may be substantially symmetric with respect to the first direction.

A pixel circuit may not be disposed in the second partial area.

The second area may be unfolded in a first mode and may be folded or rolled in a second mode.

The display panel may further include connection lines electrically connecting the first partial circuit and the second partial circuit, and at least some of the connection lines may overlap corresponding openings among the openings in plan view.

The display panel further may include scan line supplying a scan signal to the pixel circuit of the first group and the pixel circuit of the second group, and the scan line may overlap the support area in plan view.

The display device according to an embodiment may further include a data line intersecting the scan line in plan view and supplies a data signal to the pixel circuit of the first group and the pixel circuit of the second group, and a portion of the data line may overlap a corresponding opening among the openings in plan view.

According to an embodiment, a display device may include a display panel that may include a first area and a second area. A shape of the first area is uniform, a shape of the second area changes as an operation mode switches, The second area may include a first partial area that may include a pixel circuit of a first group, a pixel circuit of a second group, and a first light emitting device electrically connected to the pixel circuit of the first group or the pixel circuit of the second group, and a second partial area that may include a second light emitting device electrically connected to the pixel circuit of the first group and the pixel circuit of the second group. The pixel circuit of the second group may include a first partial circuit and a second partial circuit disposed in an area and an opposite area of the first partial area, which are adjacent to each other, with the second partial area disposed between the first partial area and the second partial area, and the first partial circuit and the second partial circuit may be electrically connected by a connection line intersecting the second partial area.

BRIEF DESCRIPTION OF THE DRAWINGS

The above and other objects and features of the disclosure will become apparent by describing in detail embodiments thereof with reference to the accompanying drawings in which.

DETAILED DESCRIPTION OF THE EMBODIMENTS

Figure 1:
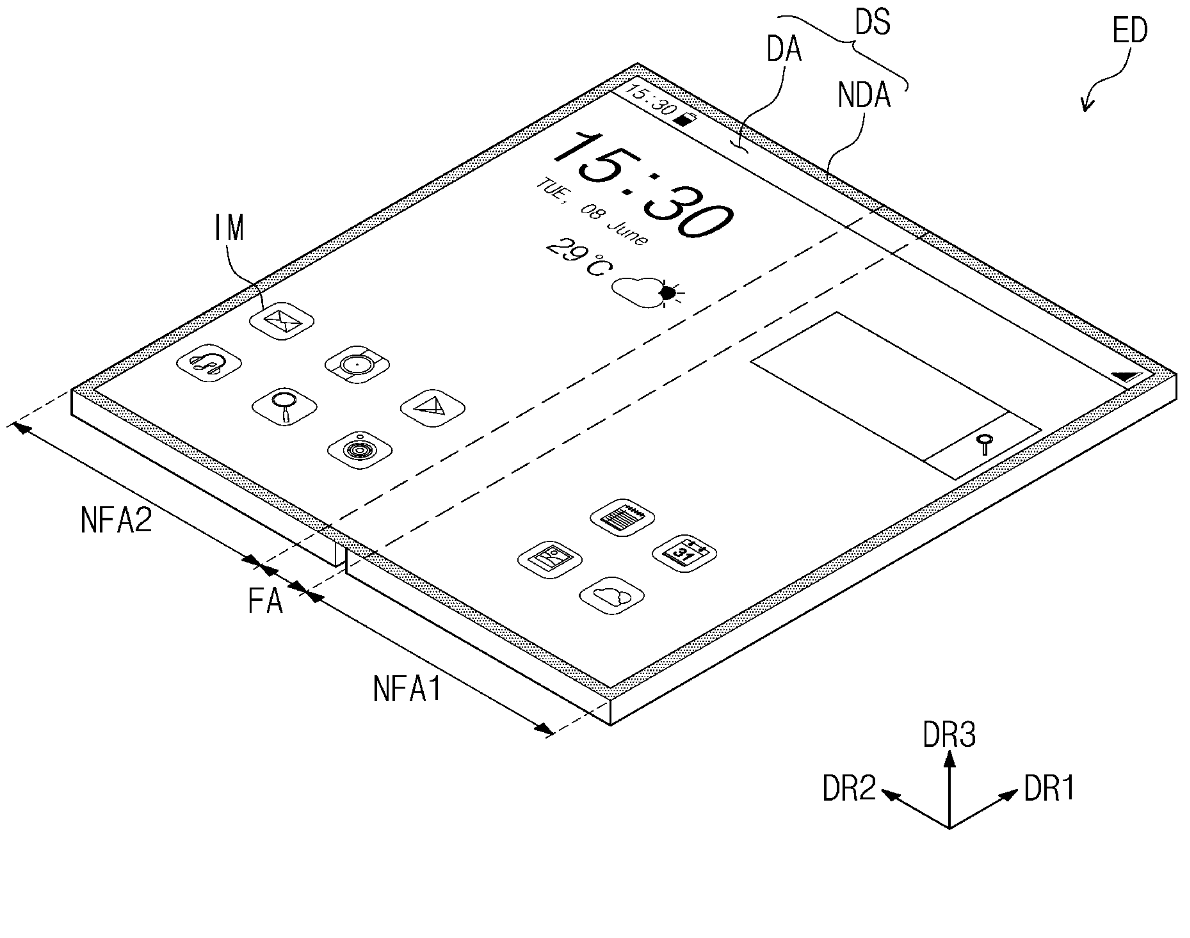
FIG. 1 is a schematic perspective view of an electronic device unfolded, according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification, the expression that a first component (or area, layer, part, portion, etc.) is "on", "connected with", or "coupled to" a second component means that the first component is directly on, connected with, or coupled to the second component or means that a third component or other components may be disposed therebetween.

Like reference numerals refer to like components. Also, in drawings, the thickness, ratio, and dimension of components are exaggerated for effectiveness of description of technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first", "second", etc. may be used to describe various components, the components should not be construed as being limited by the terms. The terms are only used to distinguish one component from another component. For example, without departing from the scope and spirit of the disclosure, a first component may be referred to as a "second component", and similarly, the second component may be referred to as the "first component".

As used herein, the singular forms, "a," "an," and "the" are intended to include the plural forms as well, unless the context clearly indicates otherwise.

Also, the terms "under", "below", "on", "above", etc. are used to describe the correlation of components illustrated in drawings. The terms are relative and are described with reference to a direction indicated in the drawing but are not limited thereto.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value."

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. The term "overlap" or "overlapped" means that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other. Unless otherwise defined or implied herein, all terms (including technical terms and scientific terms) used in the specification have the same meaning as commonly understood by one skilled in the art to which the disclosure belongs. Terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments will be described with reference to accompanying drawings.

Figure 2:
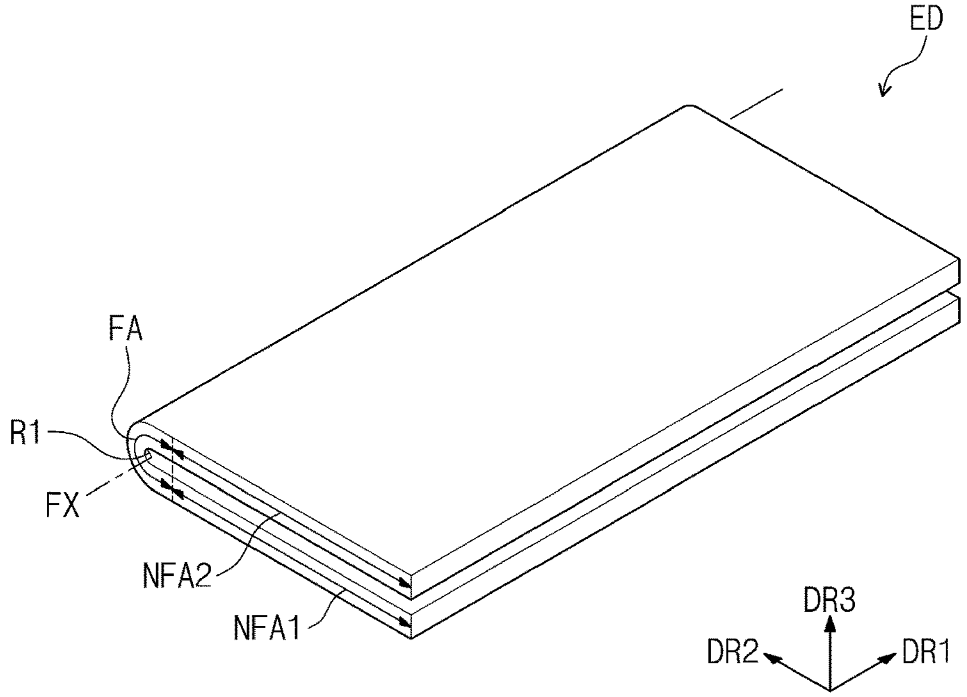
FIGS. 2 and 3 are schematic perspective views of an electronic device folded, according to an embodiment.
Figure 3:
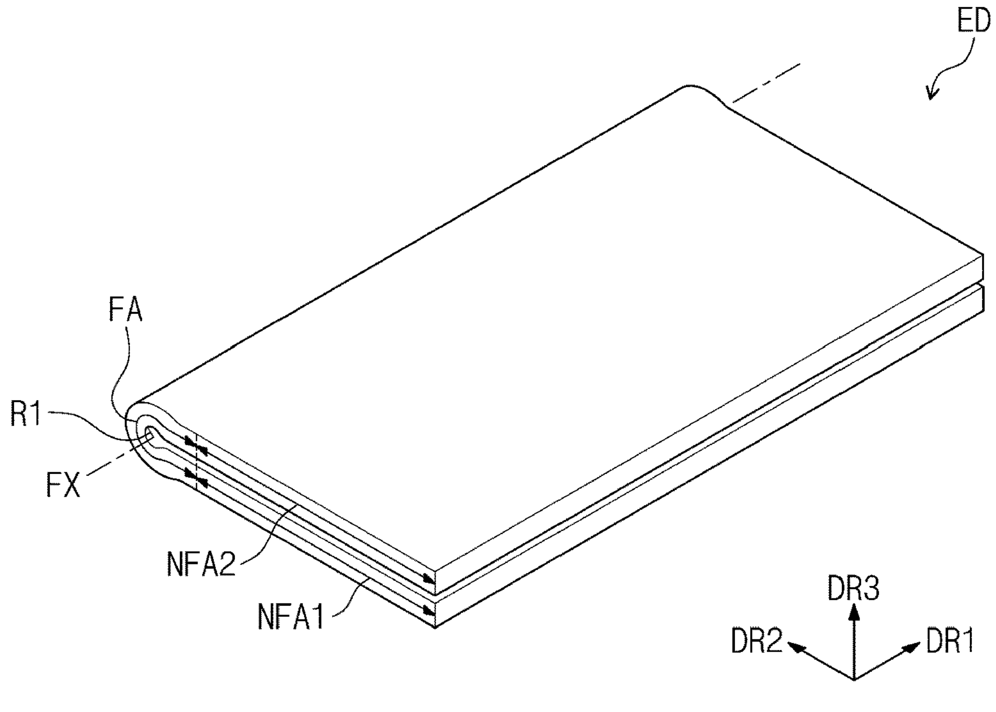

FIG. 1 is a schematic perspective view of an electronic device ED unfolded, according to an embodiment. FIGS. 2 and 3 are schematic perspective views of the electronic device ED folded, according to an embodiment.

FIGS. 1 to 3 are schematic perspective views of the electronic device ED according to an embodiment. FIG. 1 shows an unfolded state, and FIGS. 2 and 3 show a folded state.

Referring to FIGS. 1 to 3, the electronic device ED according to an embodiment of the disclosure may include a display surface DS that is defined by a first direction DR1 and a second direction DR2 intersecting the first direction DR1. The electronic device ED may provide an image IM to the user through the display surface DS.

The display surface DS may include a display area DA and a non-display area NDA around the display area DA. The display area DA may display the image IM, and the non-display area NDA may not display the image IM. The non-display area NDA may surround or may be adjacent to the display area DA. However, the disclosure is not limited thereto. For example, a shape of the display area DA and a shape of the non-display area NDA may be modified.

Below, a direction that is substantially perpendicular to a plane defined by the first direction DR1 and the second direction DR2 is defined as a third direction DR3. The third direction DR3 may be used as a reference for classifying a front surface and a rear surface of each member. In the specification, the expression "when viewed from above a plane" may mean "when viewed in the third direction DR3". Below, the first to third directions DR1, DR2, and DR3 refer to the same drawing sign in a direction that each of the first to third directions DR1, DR2, and DR3 indicates.

The electronic device ED may include a folding area FA and non-folding areas NFA1 and NFA2. The non-folding areas NFA1 and NFA2 may include the first non-folding area NFA1 and the second non-folding area NFA2. In the second direction DR2, the folding area FA may be disposed between the first non-folding area NFA1 and the second non-folding area NFA2.

The electronic device ED of a first mode may be defined as being in an unfolded state, and the electronic device ED of a second mode may be defined as being in a folded state. As the electronic device ED changes from the first mode to the second mode, the shape of the folding area FA may be changed, but the shapes of the non-folding areas NFA1 and NFA2 may not change.

As illustrated in FIG. 2, the folding area FA may be folded about a folding axis FX parallel to the first direction DR1. The folding area FA has a give curvature and a curvature radius R1. The first non-folding area NFA1 and the second non-folding area NFA2 may face each other; the electronic device ED may be inner-folded such that the display surface DS is not exposed to the outside.

In an embodiment, the electronic device ED may be outer-folded such that the display surface DS is exposed to the outside. In an embodiment, the electronic device ED may be configured such that the switch from the unfolded operation to the inner-folding or outer-folding operation and the switch from the inner-folding or outer-folding operation to the unfolded operation are repeated, but the disclosure is not limited thereto. In an embodiment, the electronic device ED may be configured to select one of the unfolded operation, the inner-folding operation, and the outer-folding operation.

As illustrated in FIG. 2, a distance between the first non-folding area NFA1 and the second non-folding area NFA2 may be substantially identical to two times the curvature radius R1; however, as illustrated in FIG. 3, the distance between the first non-folding area NFA1 and the second non-folding area NFA2 may be smaller than two times the curvature radius R1. FIGS. 2 and 3 are illustrated based on the display surface DS, and a housing HM (refer to FIG. 4) forming the exterior of the electronic device ED may contact end regions of the first non-folding area NFA1 and the second non-folding area NFA2.

Figure 4:
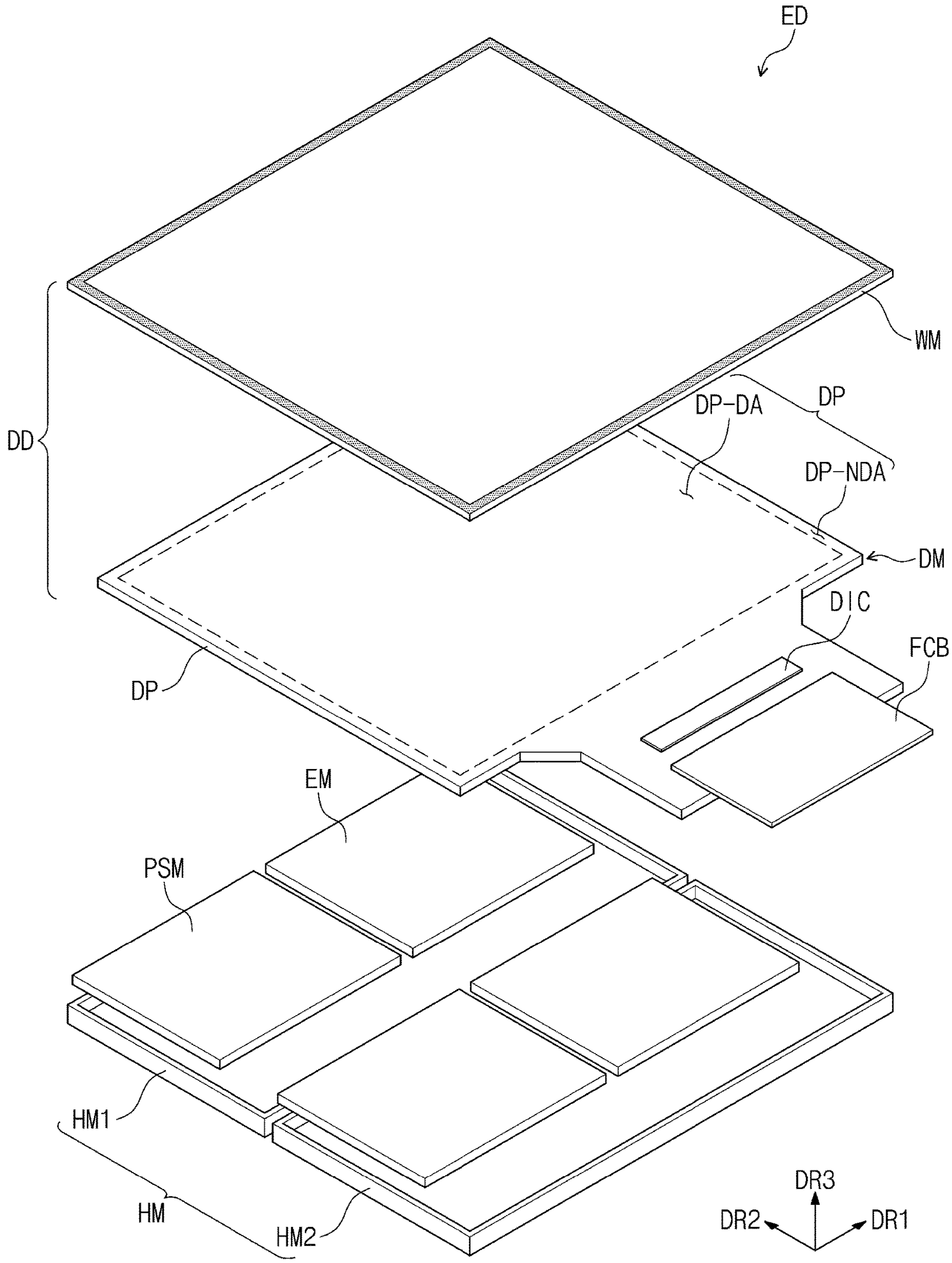
FIG. 4 is an exploded schematic perspective view of an electronic device according to an embodiment.

FIG. 4 is an exploded schematic perspective view of the electronic device ED according to an embodiment.

As illustrated in FIG. 4, the electronic device ED may include a display device DD, an electronic module EM, a power module PSM, and the housing HM. Although not separately illustrated, the electronic device ED may further include a mechanical structure for controlling the folding operation of the display device DD.

The display device DD generates an image and senses an external input. The display device DD may include a window WM and a display module DM. The window WM provides the front surface of the electronic device ED.

The display module DM may at least include a display panel DP. Only the display panel DP of a stacked structure of the display module DM is illustrated in FIG. 4, but the display module DM may substantially further include components disposed on the upper side of the display panel DP. The stacked structure of the display module DM will be described in detail later.

The display panel DP may not be particularly limited; for example, the display panel DP may be a light emitting display panel such as an organic light emitting display panel or an inorganic light emitting display panel.

The display panel DP may include a display area DP-DA and a non-display area DP-NDA respectively corresponding to the display area DA (refer to FIG. 1) and the non-display area NDA (refer to FIG. 1) of the electronic device ED. In the specification, the expression "an area/portion corresponds to another area/portion" means that an area/portion overlaps another area/portion and does not mean that the areas/portions have the same area.

As illustrated in FIG. 4, a driver chip DIC may be disposed on the non-display area DP-NDA of the display panel DP. A flexible circuit board FCB may be coupled or connected to the non-display area DP-NDA of the display panel DP. The flexible circuit board FCB may be connected with a main circuit board. The main circuit board may be one electronic part constituting the electronic module EM.

The driver chip DIC may include driving elements for driving pixels of the display panel DP, for example, a data driving circuit. A structure in which the driver chip DIC is mounted on the display panel DP is illustrated in FIG. 4, but the disclosure is not limited thereto. For example, the driver chip DIC may be mounted on the flexible circuit board FCB.

The electronic module EM may include a control module, a wireless communication module, an image input module, a sound input module, a sound output mode, a memory, an external interface, etc. The electronic module EM may include the main circuit board, and the modules may be mounted on the main circuit board or may be electrically connected with the main circuit board through a flexible circuit board. The electronic module EM is electrically connected with the power module PSM.

Referring to FIG. 4, the electronic module EM may be disposed in each of a first housing HM1 and a second housing HM2, and the power module PSM may be disposed in each of the first housing HM1 and the second housing HM2. Although not illustrated, the electronic module EM disposed in the first housing HM1 and the electronic module EM disposed in the second housing HM2 may be electrically connected through a flexible circuit board.

Although not separately illustrated, the electronic device ED may further include an electro-optical module. The electro-optical module may be an electronic part that outputs or receives a light signal. The electro-optical module may include a camera module and/or a proximity sensor. The camera module may photograph an external image through a partial area of the display panel DP.

The housing HM illustrated in FIG. 4 is coupled or connected to the display device DD, by way of example, the window WM to accommodate the other modules. An example in which the housing HM may include the first and second housings HM1 and HM2 separated from each other is illustrated, but the disclosure is not limited thereto. Although not illustrated, the electronic device ED may further include a hinge structure for connecting the first and second housings HM1 and HM2.

Figure 5:
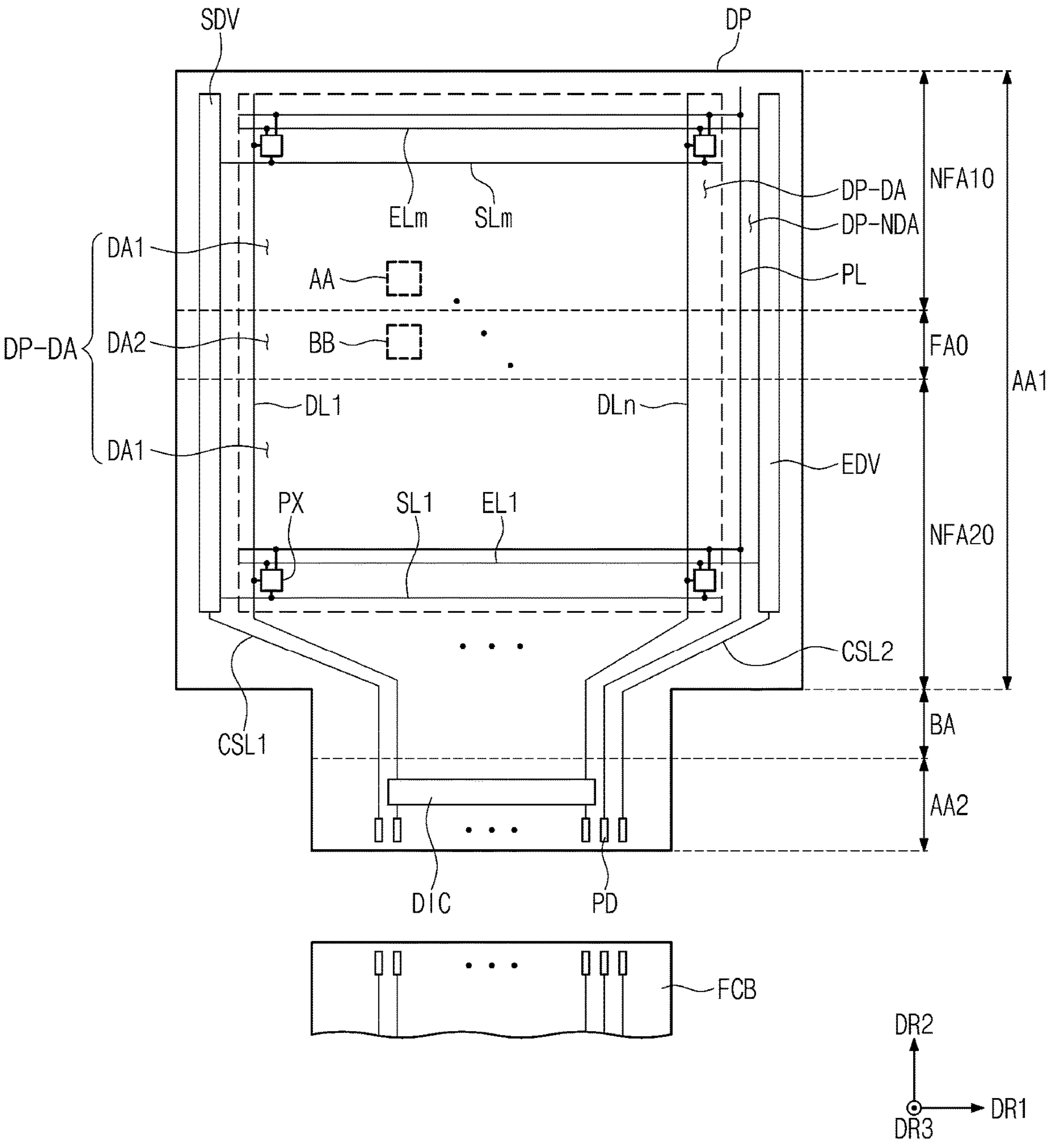
FIG. 5 is a schematic plan view of a display panel according to an embodiment.

FIG. 5 is a schematic plan view of the display panel DP according to an embodiment.

Referring to FIG. 5, the display panel DP may include the display area DP-DA and the non-display area DP-NDA around the display area DP-DA. A pixel PX is disposed in the display area DP-DA. A scan driver SDV, a data driver, and an emission driver EDV may be disposed in the non-display area DP-NDA. The data driver may be a part of a circuit implemented in the driver chip DIC illustrated in FIG. 4. The display area DP-DA may also further include areas AA and BB as illustrated in FIG. 5.

The display panel DP may include a first area AA1, a second area AA2, and a bending area BA that are classified from each other in the second direction DR2. The second area AA2 and the bending area BA may be a portion of the non-display area DP-NDA. The bending area BA is disposed between the first area AA1 and the second area AA2.

The first area AA1 is an area corresponding to the display surface DS of FIG. 1. The first area AA1 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIG. 3.

The display area DP-DA may include two first display areas DA1 corresponding to the first non-folding area NFA10 and the second non-folding area NFA20 and a second display area DA2 corresponding to the folding area FAO.

A length of the bending area BA and the second area AA2 in the first direction DR1 may be smaller than a length of the first area AA1 in the first direction DR1. An area in which a length in a bending axis direction is short may be bent more readily.

The display panel DP may include pixels PX, scan lines SL1 to SLm, data lines DL1 to DLn, emission lines EL1 to ELm, a first control line CSL1, a second control line CSL2, a power line PL, and pads PD. Herein, m and n are a natural number. The pixels PX may be connected with the scan lines SL1 to SLm, the data lines DL1 to DLn, and the emission lines EL1 to ELm.

The scan lines SL1 to SLm may extend in the second direction DR2 and may be connected with the scan driver SDV. The data lines DL1 to DLn may extend in the second direction DR2 and may be connected with the driver chip DIC through the bending area BA. The emission lines EL1 to ELm may extend in the first direction DR1 and may be connected with the emission driver EDV.

The power line PL may include a portion extending in the second direction DR2 and a portion extending in the first direction DR1. The portion extending in the first direction DR1 and the portion extending in the second direction DR2 may be disposed on different layers. The portion of the power line PL, which extends in the second direction DR2, may extend to the second area AA2 through the bending area BA. The power line PL may provide a first voltage to the pixels PX.

The first control line CSL1 may be connected with the scan driver SDV and may extend to a lower end of the second area AA2 through the bending area BA. The second control line CSL2 may be connected with the emission driver EDV and may extend to the lower end of the second area AA2 through the bending area BA.

In a plan view, the pads PD may be disposed adjacent to the lower end of the second area AA2. The driver chip DIC, the power line PL, the first control line CSL1, and the second control line CSL2 may be connected with the pads PD. The flexible circuit board FCB may be electrically connected with the pads PD through an anisotropic conductive adhesive layer.

Figure 6:
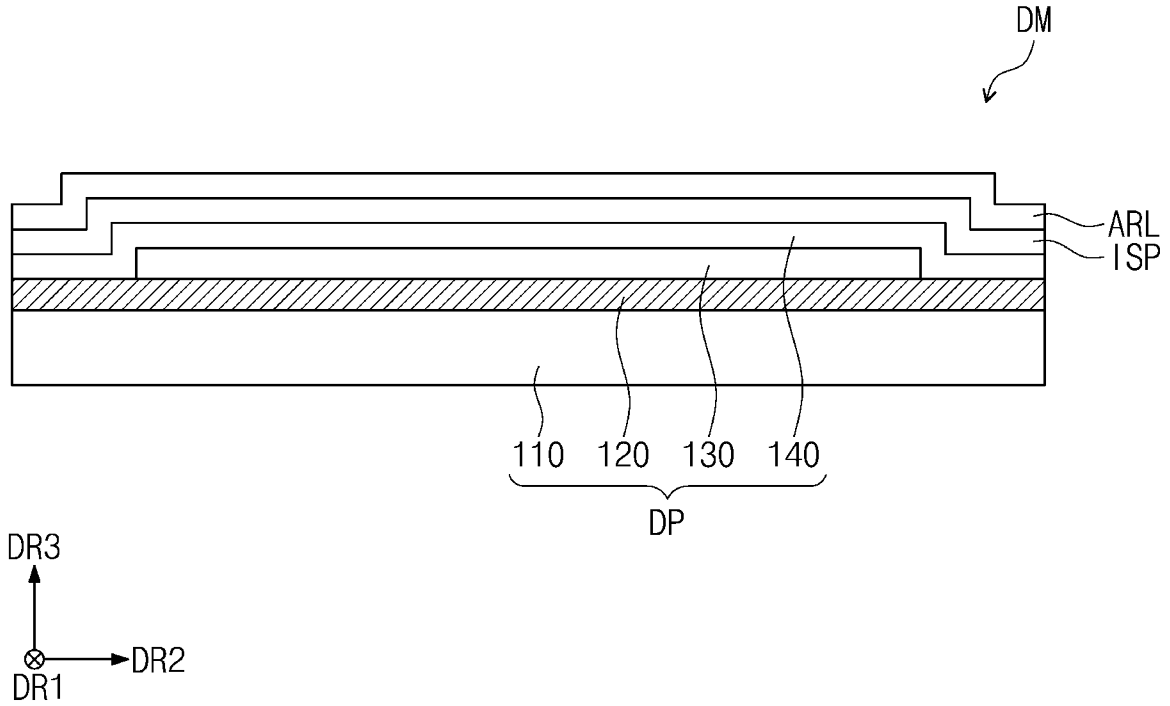
FIG. 6 is a schematic cross-sectional view of a display module according to an embodiment.

FIG. 6 is a schematic cross-sectional view of the display module DM according to an embodiment.

Referring to FIG. 6, the display module DM may include the display panel DP, an input sensor ISP, and an anti-reflection layer ARL. The display panel DP may include a base layer 110, a circuit layer 120, a light emitting device layer 130, and an encapsulation layer 140.

The base layer 110 may provide a base surface on which the circuit layer 120 is disposed. The base layer 110 may be a flexible substrate allowing bending, folding, or rolling. The base layer 110 may be a glass substrate, a metal substrate, a polymer substrate, etc. However, an embodiment is not limited thereto. For example, the base layer 110 may be an inorganic layer, an organic layer, or a composite material layer.

The base layer 110 may have a multi-layer structure. For example, the base layer 110 may include a first synthetic resin layer, an inorganic layer of a multi-layer structure or a single-layer structure, and a second synthetic resin layer disposed on the inorganic layer of the multi-layer structure or the single-layer structure. Each of the first and second synthetic resin layers may include polyimide-based resin, but the disclosure is not limited thereto.

The circuit layer 120 may be disposed on the base layer 110. The circuit layer 120 may include an insulating layer, a semiconductor pattern, a conductive pattern, a signal line, etc.

The light emitting device layer 130 may be disposed on the circuit layer 120. The light emitting device layer 130 may include a light emitting device. For example, the light emitting device may include an organic light emitting material, an inorganic light emitting material, an organic-inorganic light emitting material, a quantum dot, a quantum rod, a micro-LED, or a nano-LED.

The encapsulation layer 140 may be disposed on the light emitting device layer 130. The encapsulation layer 140 may protect the light emitting device layer 130 from foreign substances such as moisture, oxygen, and dust particles. The encapsulation layer 140 may include at least one inorganic layer. The encapsulation layer 140 may include a structure in which an inorganic layer, an organic layer, and an inorganic layer may be sequentially stacked each other.

The input sensor ISP may be disposed on or may be directly disposed on the display panel DP. The input sensor ISP may sense an input of the user in a capacitive manner. The display panel DP and the input sensor ISP may be formed through a successive process. Herein, the expression “being directly disposed” may mean that a third component is not disposed between the input sensor ISP and the display panel DP. That is, a separate adhesive layer may not be disposed between the input sensor ISP and the display panel DP.

The anti-reflection layer ARL may be disposed on or may be directly disposed on the input sensor ISP. The anti-reflection layer ARL may reduce the reflectance of an external light incident from the outside of the display device DD (refer to FIG. 4). The anti-reflection layer ARL may include color filters. The color filters may have a given arrangement. For example, the color filters may be arranged or disposed in consideration of colors of lights emitted from pixels included in the display panel DP. Also, the anti-reflection layer ARL may further include a black matrix adjacent to the color filters.

In an embodiment, the locations of the input sensor ISP and the anti-reflection layer ARL may be interchangeable. In an example, the anti-reflection layer ARL may mostly a polarizing film. The polarizing film may be coupled or connected to the input sensor ISP through an adhesive layer.

Figure 7:
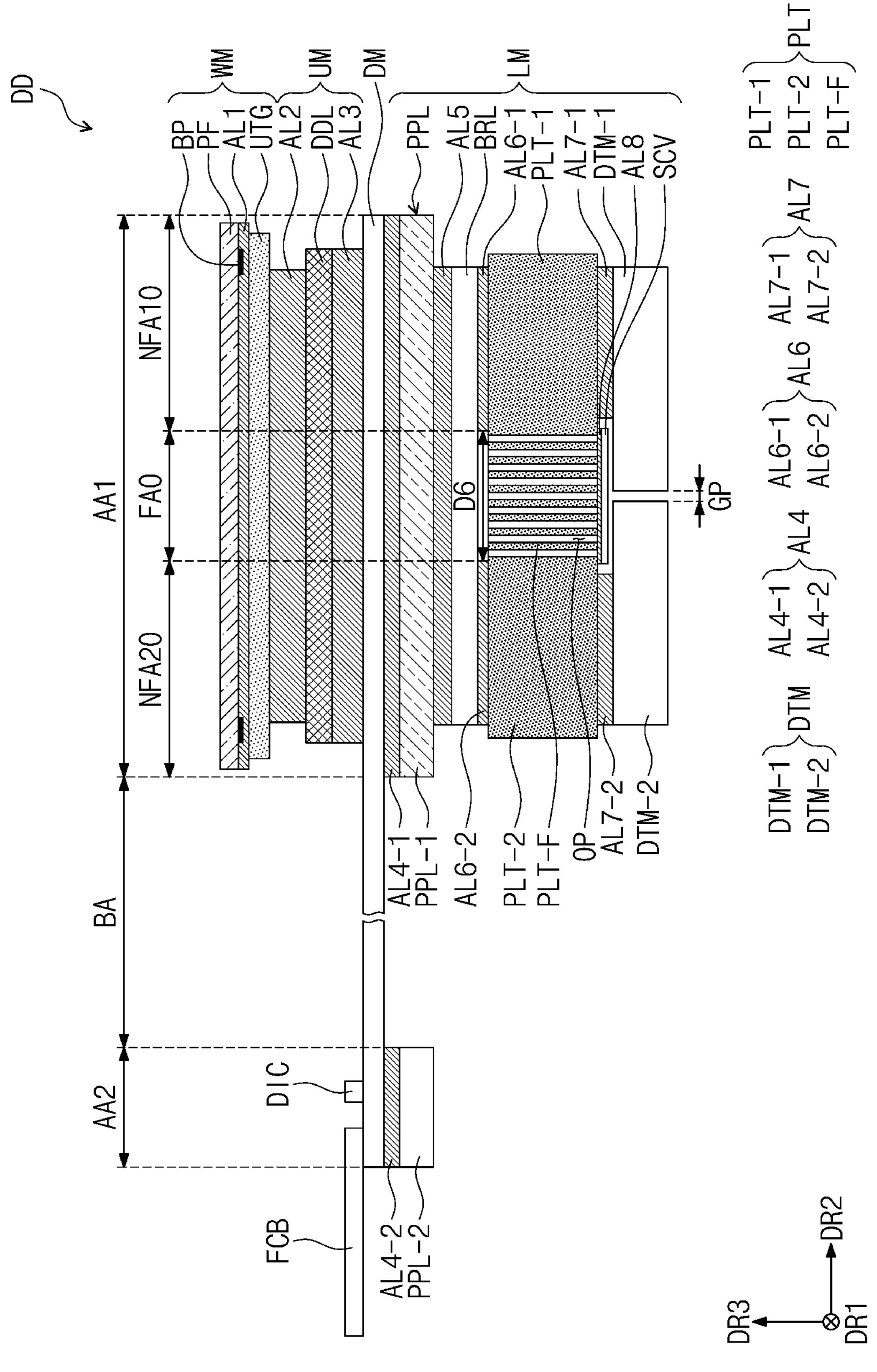
FIG. 7 is a schematic cross-sectional view of a display device according to an embodiment.
Figure 8:
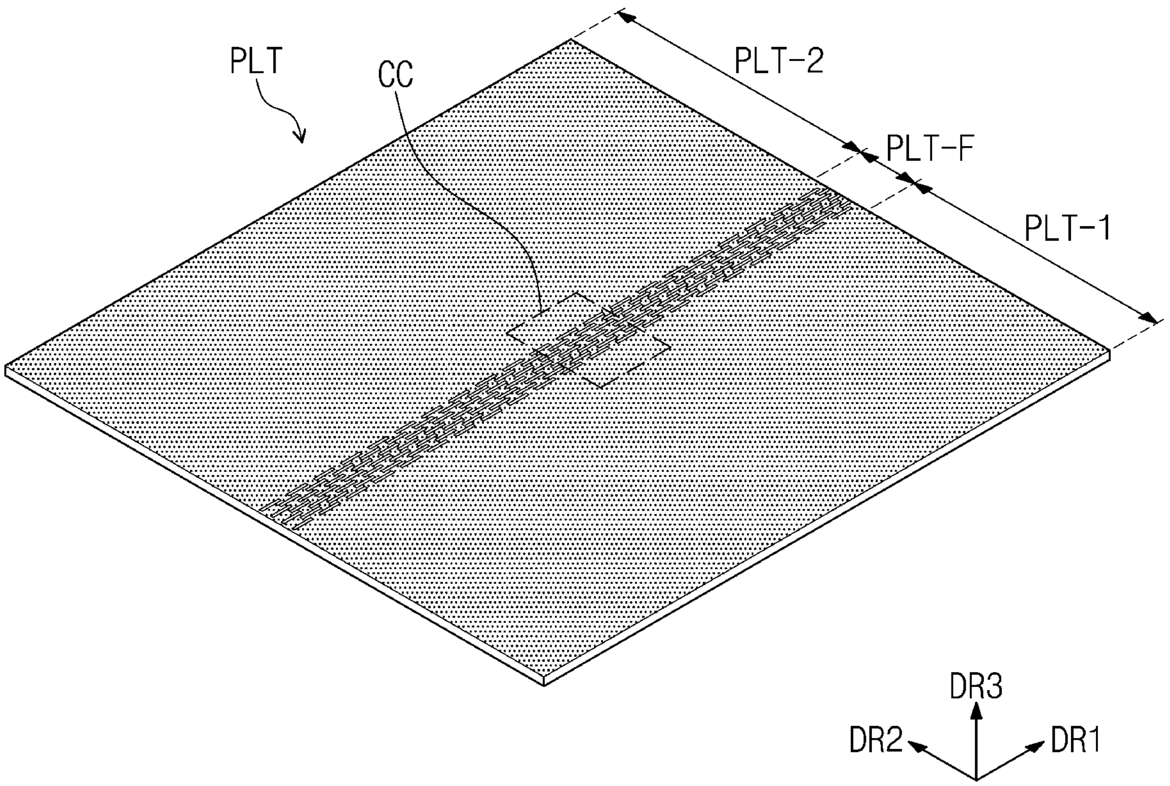
FIG. 8 is a schematic perspective view of a support plate according to an embodiment.
Figure 9:
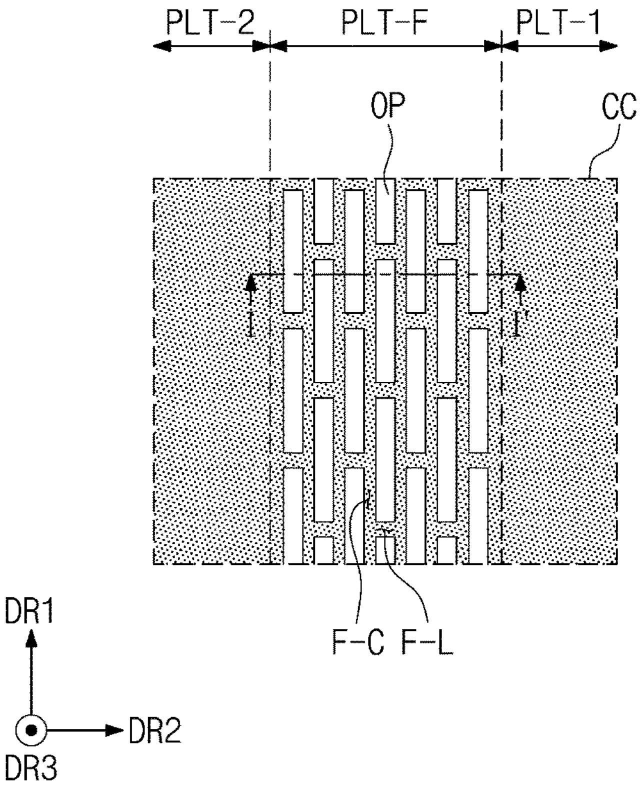
FIG. 9 is an enlarged schematic plan view of a portion of a support plate illustrated in FIG. 8.
Figure 10:
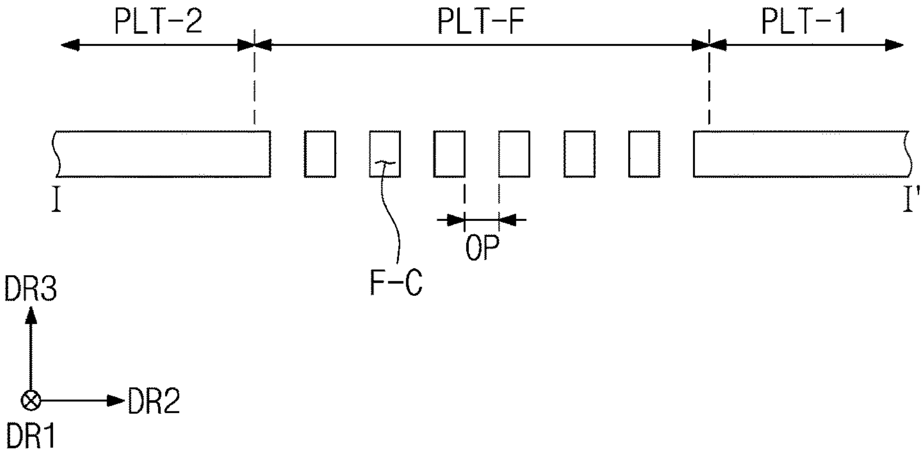
FIG. 10 is a schematic cross-sectional view corresponding to line I-I' of FIG. 9.

FIG. 7 is a schematic cross-sectional view of the display device DD according to an embodiment, FIG. 8 is a schematic perspective view of a support plate PLT according to an embodiment, FIG. 9 is an enlarged schematic plan view of a portion of the support plate PLT illustrated in FIG. 8, and FIG. 10 is a schematic cross-sectional view corresponding to line I-I' of FIG. 9. FIG. 8 and FIG. 9 also include area CC with respect to PLT-F.

FIG. 7 shows an unfolded state where the display module DM is not folded. In FIG. 7, the display module DM is divided into areas based on the display panel DP of FIG. 3.

Referring to FIG. 7, the display device DD may include the window WM, an upper member UM, the display module DM, and a lower member LM. The upper member UM is commonly called a configuration disposed between the window WM and the display module DM, and the lower member LM is commonly called a configuration disposed on the lower side of the display module DM.

The window WM may include an ultrathin glass substrate UTG, a window protection layer PF disposed on the ultrathin glass substrate UTG, and a bezel pattern BP disposed on a lower surface of the window protection layer PF. In an embodiment, the window protection layer PF may include a synthetic resin film. The window WM may include an adhesive layer AL1 (hereinafter referred to as a “first adhesive layer”) coupling or connecting the window protection layer PF and the ultrathin glass substrate UTG together.

The bezel pattern BP overlaps the non-display area NDA illustrated in FIG. 1. The bezel pattern BP may be disposed on one surface or a surface of the ultrathin glass substrate UTG or on one surface or a surface of the window protection layer PF. An example in which the bezel pattern BP is disposed on the lower surface of the window protection layer PF is illustrated in FIG. 7. However, the disclosure is not limited thereto. For example, the bezel pattern BP may be disposed on an upper surface of the window protection layer PF. The bezel pattern BP that is a colored light blocking film may be formed, for example, in a coating manner. The bezel pattern BP may include a base material and a dye or pigment mixed with the base material.

The thickness of the ultrathin glass substrate UTG may be in a range of about 15 μm to about 45 μm. The ultrathin glass substrate UTG may be a chemical strengthening glass. Even though the folding operation and the unfolding operation are repeated, the ultrathin glass substrate UTG may minimize the occurrence of wrinkle.

The thickness of the window protection layer PF may be in a range of about 50 μm to about 80 μm. The synthetic resin film of the window protection layer PF may include polyimide, polycarbonate, polyamide, triacetylcellulose, polymethylmethacrylate, or polyethylene terephthalate. Although not separately illustrated, at least one of a hard coating layer, a fingerprint-resistant layer, and an anti-reflection layer may be disposed on the upper surface of the window protection layer PF.

The first adhesive layer AL1 may be a pressure sensitive adhesive film (PSA) or an optically clear adhesive (OCA). Adhesive layers to be described below may also include the same adhesive as the first adhesive layer AL1.

The first adhesive layer AL1 may be separated (or removed) from the ultrathin glass substrate UTG. Because the strength of the window protection layer PF is low compared to the ultrathin glass substrate UTG, scratches may relatively readily occur thereon. A new window protection layer PF may be attached to the ultrathin glass substrate UTG after separating the first adhesive layer AL1 from the window protection layer PF.

The upper member UM may include an upper film DDL. The upper film DDL may include a synthetic resin layer. The synthetic resin film may include polyimide, polycarbonate, polyamide, triacetylcellulose, polymethylmethacrylate, or polyethylene terephthalate.

The upper film DDL may absorb the external impact applied to the front surface of the display device DD. The display module DM described with reference to FIG. 6 may include the anti-reflection layer ARL replacing the polarizing film; the impact strength for the front surface of the display device DD may decrease. The upper film DDL may compensate for the decreased impact strength by applying the anti-reflection layer ARL. In an embodiment, the upper film DDL may be omitted. The upper member UM may include a second adhesive layer AL2 coupling or connecting the upper film DDL and the window WM together and a third adhesive layer AL3 coupling or connecting the upper film DDL and the display module DM together.

The lower member LM may include a panel protection layer PPL, a barrier layer BRL, the support plate PLT, a cover layer SCV, a digitizer DTM, and fourth to eighth adhesive layers AL4 to AL8. In an embodiment, some or a number of the above components may be omitted. For example, the barrier layer BRL, the cover layer SCV, or the digitizer DTM and an adhesive layer related thereto may be omitted.

The panel protection layer PPL may be disposed on the lower side of the display module DM. The panel protection layer PPL may protect a lower portion of the display module DM. The panel protection layer PPL may include a flexible synthetic resin film. For example, the panel protection layer PPL may include polyethylene terephthalate.

In an embodiment, the panel protection layer PPL may not be disposed in the bending area BA. The panel protection layer PPL may include a first panel protection layer PPL-1 protecting the first area AA1 of the display panel DP (refer to FIG. 1) and a second panel protection layer PPL-2 protecting the second area AA2 thereof. The first area AA1 may provide a flat support surface.

The fourth adhesive layer AL4 couples or connects the panel protection layer PPL and the display panel DP together. The fourth adhesive layer AL4 may include a first portion AL4-1 corresponding to the first panel protection layer PPL-1 and a second portion AL4-2 corresponding to the second panel protection layer PPL-2.

Although not illustrated, in case that the bending area BA is bent, the second panel protection layer PPL-2 may be disposed on the lower side of the first area AA1 and the first panel protection layer PPL-1 together with the second area AA2. Because the panel protection layer PPL is not disposed in the bending area BA, the bending area BA may be bent more readily.

As illustrated in FIG. 7, the fifth adhesive layer AL5 couples or connects the panel protection layer PPL and the barrier layer BRL together. The barrier layer BRL may be disposed on the lower side of the panel protection layer PPL. The barrier layer BRL may increase resistance against the compressive force caused by the external press. Accordingly, the barrier layer BRL may serve to prevent deformation of the display panel DP. The barrier layer BRL may include a flexible plastic material such as polyimide or polyethylene terephthalate. Also, the barrier layer BRL may be a colored film whose light transmittance is low. The barrier layer BRL may absorb the light incident from the outside. For example, the barrier layer BRL may be a black synthetic resin film. When viewing the display device DD from the upper side of the window protection layer PF, components disposed on the lower side of the barrier layer BRL may not be visually perceived by the user.

The sixth adhesive layer AL6 couples or connects the barrier layer BRL and the support plate PLT together. The sixth adhesive layer AL6 may include a first portion AL6-1 and a second portion AL6-2 spaced from each other. A separation distance D6 (or an interval) of the first portion AL6-1 and the second portion AL6-2 corresponds to a width of the folding area FAO and is greater than a gap GP to be described later.

The support plate PLT is disposed on the lower side of the barrier layer BRL. The support plate PLT supports components disposed on the upper side of a support layer and maintains an unfolded state and a folded state of the display device DD. The strength of the support plate PLT is greater than that of the barrier layer BRL.

The support plate PLT may include a metal material having high strength. The support plate PLT may include a material having an elastic modulus of about 60 GPa or more. The support plate PLT may include a metal material such as stainless steel.

The support plate PLT may include a reinforced fiber composite material. The support plate PLT may include reinforced fiber disposed inside a matrix part. The reinforced fiber may be carbon fiber or glass fiber. The matrix part may include polymer resin. The matrix part may include thermoplastic resin. For example, the matrix part may include polyamide-based resin or polypropylene-based resin. For example, the reinforced fiber composite material may be carbon fiber reinforced plastic (CFRP) or glass fiber reinforced plastic (GFRP).

Referring to FIGS. 7 to 10, the support plate PLT at least may include a first support plate PLT-1 corresponding to the first non-folding area NFA10 and a second support plate PLT-2 corresponding to the second non-folding area NFA20. The support plate PLT may include a folding portion PLT-F that corresponds to the folding area FAO and is disposed between the first support plate PLT-1 and the second support plate PLT-2 and in which openings OP are defined. The first support plate PLT-1, the second support plate PLT-2, and the folding portion PLT-F may have an integral shape.

As described with reference to FIGS. 1 to 3, as the electronic device ED switches from the first mode to the second mode, the shape of the folding portion PLT-F is changed, but the shape of the first support plate PLT-1 and the second support plate PLT-2 is not changed. Each of the first support plate PLT-1 and the second support plate PLT-2 provides a flat support surface regardless of an operation mode. The first support plate PLT-1 and the second support plate PLT-2 may be defined as a first area in which the shape is not changed even though the operation mode of the electronic device ED switches, and the folding portion PLT-F may be defined as a second area in which the shape is changed in case that the operation mode of the electronic device ED switches.

As illustrated in FIG. 9, the openings OP may be arranged or disposed such that the folding area FAO has a lattice shape in a plan view. The flexibility of the folding portion PLT-F is improved by the openings OP. In the folding operation illustrated in FIGS. 2 and 3, the folding portion PLT-F may prevent foreign objects from being infiltrated into a central area of the barrier layer BRL opened from the first support plate PLT-1 and the second support plate PLT-2. The flexibility of the folding portion PLT-F is improved by the openings OP.

As illustrated in FIG. 9, the openings OP are defined in the folding portion PLT-F. The remaining area other than the openings OP is defined as a support area. The support area may include first extension portions F-C and second extension portions F-L. The support area may have a lattice shape. Each of the first extension portions F-C extends in the first direction DR1, and the first extension portions F-C are arranged or disposed in the second direction DR2. Each of the second extension portions F-L extends in the second direction DR2 and is disposed between the first extension portions F-C. The first extension portions F-C may be located or disposed such that the openings OP are zigzag disposed along the second direction DR2.

As illustrated in FIG. 10, each of the openings OP may have a uniform width. The width of each of the openings OP may have a given value without change in the third direction DR3.

Referring to FIG. 7, the cover layer SCV and the digitizer DTM are disposed on the lower side of the support plate PLT. The cover layer SCV is disposed to overlap the folding area FAO. The digitizer DTM may include a first digitizer DTM-1 and a second digitizer DTM-2 respectively overlapping the first support plate PLT-1 and the second support plate PLT-2. A portion of each of the first digitizer DTM-1 and the second digitizer DTM-2 may be disposed on the lower side of the cover layer SCV.

The seventh adhesive layer AL7 couples or connects the support plate PLT and the digitizer DTM together, and the eighth adhesive layer AL8 couples or connects the cover layer SCV and the support plate PLT together. The seventh adhesive layer AL7 may include a first portion AL7-1 coupling or connecting the first support plate PLT-1 and the first digitizer DTM-1 together and a second portion AL7-2 coupling or connecting the second support plate PLT-2 and the second digitizer DTM-2 together.

The cover layer SCV may be disposed between the first portion AL7-1 and the second portion AL7-2 in the second direction DR2. The cover layer SCV may be spaced from the digitizer DTM for the purpose of preventing interference against the digitizer DTM in the unfolded state. A sum of thicknesses of the cover layer SCV and the eighth adhesive layer AL8 may be smaller than a thickness of the seventh adhesive layer AL7.

The cover layer SCV may cover the openings OP of the folding portion PLT-F. The cover layer SCV may have an elastic coefficient lower than the support plate PLT. For example, the cover layer SCV may include thermoplastic polyurethane, rubber, or silicone, but the disclosure is not limited thereto.

The digitizer DTM that is called an EMR sensing panel may include loop coils that generate a magnetic field of a given resonant frequency with an electronic pen. The magnetic field formed at the loop coil is applied to an LC resonance circuit composed of an inductor (or a coil) and a capacitor of the electronic pen. The coil generates a current based on the received magnetic field and transfers the generated current to the capacitor. As such, the capacitor charges the current from the coil and discharges the charged current to the coil. As a result, the magnetic field of the resonant frequency is output from the coil. The magnetic field output from the electronic pen may be again absorbed by the loop coil of the digitizer DTM, and thus, whether the electronic pen comes close to any location of a touchscreen may be determined.

The first digitizer DTM-1 and the second digitizer DTM-2 are disposed to be spaced from each other by the given gap GP. The gap GP may be 0.3 mm to 3 mm and may be disposed to correspond to the folding area FAO.

Figure 11:
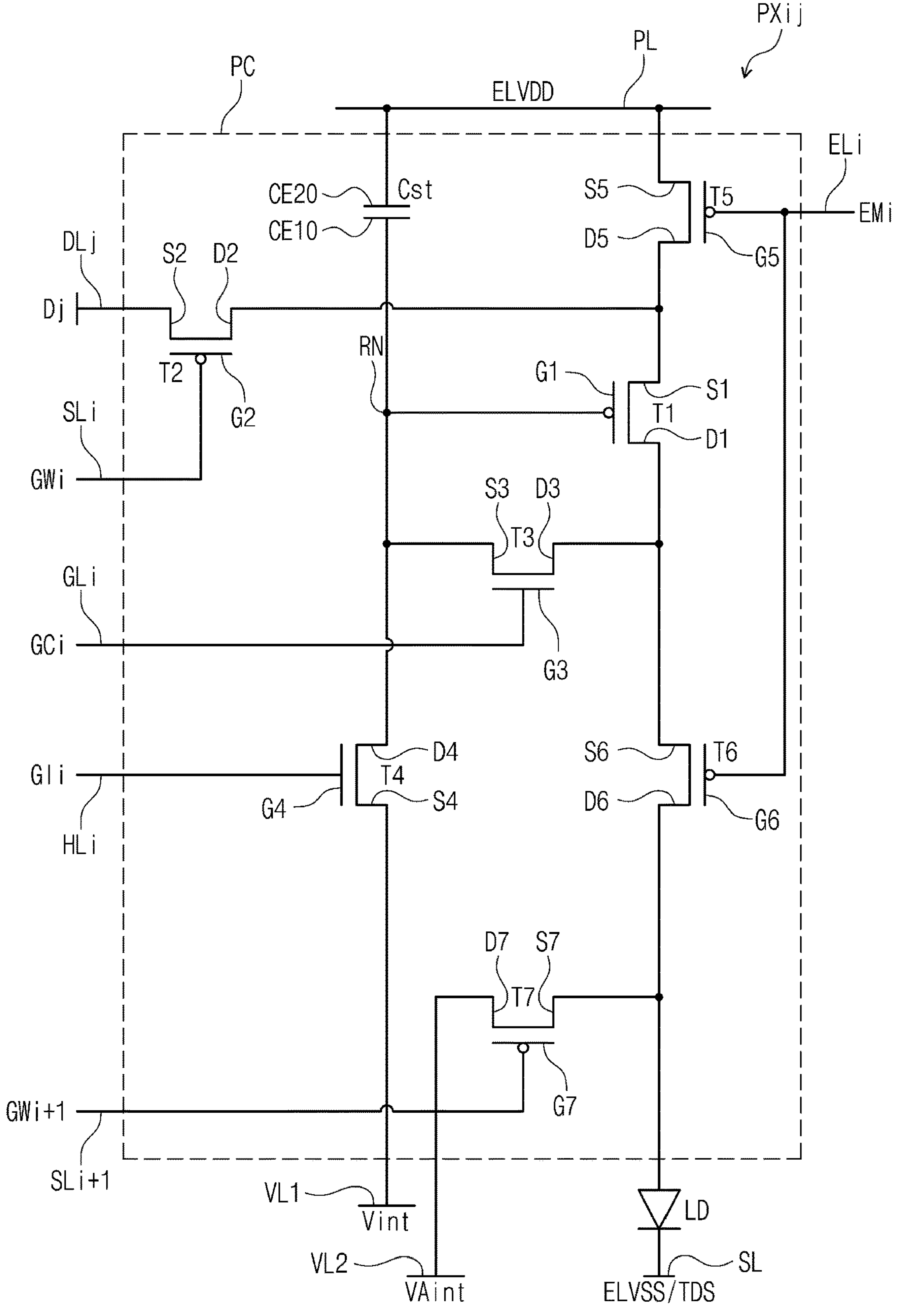
FIG. 11 is a schematic diagram of an equivalent circuit diagram of a pixel according to an embodiment.
Figure 12:
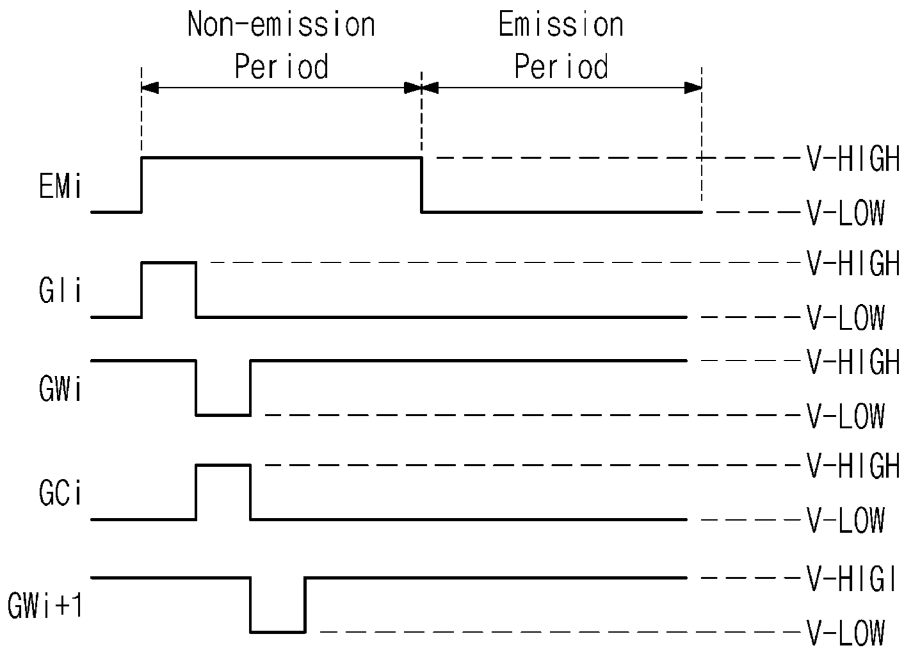
FIG. 12 is a timing diagram illustrating a method of driving a pixel, according to an embodiment.

FIG. 11 is a schematic diagram of an equivalent circuit diagram of a pixel PXij according to an embodiment, and FIG. 12 is a timing diagram illustrating a method for driving the pixel PXij, according to an embodiment.

The pixel PXij connected with an i-th scan line SLi in a first group and connected with a j-th data line DLj is illustrated in FIG. 11 as an example. The pixel PXij may include a pixel driving circuit (hereinafter referred to as a pixel circuit) PC and a light emitting device LD.

In an embodiment, the pixel circuit PC may include first to seventh transistors T1 to T7 and a capacitor Cst. In an embodiment, the description will be given under the condition that the first transistor T1, the second transistor T2, the fifth transistor T5, the sixth transistor T6, and the seventh transistor T7 are P-type transistors and the third transistor T3 and the fourth transistor T4 are N-type transistors. However, the disclosure is not limited thereto. For example, each of the first to seventh transistors T1 to T7 may be implemented with one of the P-type transistor and the N-type transistor. An input region (or input electrode) of the N-type transistor is described as a drain (or drain region), an input region of the P-type transistor is described as a source (or source region), an output region (or output electrode) of the N-type transistor is described as a source (or source region), and an output region of the P-type transistor is described as a drain (or drain region). Also, in an embodiment, at least one of the first to seventh transistors T1 to T7 may be omitted.

In an embodiment, the first transistor T1 may be a driving transistor, and the second transistor T2 may be a switching transistor. The capacitor Cst is electrically connected between the power line PL receiving a first power supply voltage ELVDD and a reference node RN. The capacitor Cst may include a first electrode CE10 electrically connected with the reference node RN and a second electrode CE20 electrically connected with the power line PL.

The light emitting device LD is electrically connected between the first transistor T1 and a signal line SL. The signal line SL may provide a second power supply voltage ELVSS or a driving signal TDS to a cathode of the light emitting device LD. The second power supply voltage ELVSS may be lower in level than the first power supply voltage ELVDD.

The first transistor T1 is electrically connected between the power line PL and an anode of the light emitting device LD. A source S1 of the first transistor T1 is electrically connected with the power line PL. In the specification, the expression "electrically connected between a transistor and a signal line or between a transistor and a transistor" may mean that a source, a drain, and a gate of the transistor is integrally formed with the signal line or is connected with the signal line through a connection electrode. Any other transistor may be disposed between the source S1 of the first transistor T1 and the power line PL, or any other transistor may not be disposed therebetween.

A drain D1 of the first transistor T1 is electrically connected with the anode of the light emitting device LD. Any other transistor may be disposed between the drain D1 of the first transistor T1 and the anode of the light emitting device LD, or any other transistor may not be disposed therebetween. A gate G1 of the first transistor T1 is electrically connected with the reference node RN.

The second transistor T2 is electrically connected between the j-th data line DLj and the first source S1 of the first transistor T1. A source S2 of the second transistor T2 is electrically connected with the j-th data line DLj, and a drain D2 of the second transistor T2 is electrically connected with the source S1 of the first transistor T1. In an embodiment, a gate G2 of the second transistor T2 is electrically connected with the i-th scan line SLi in the first group.

The third transistor T3 is connected between the reference node RN and the drain D1 of the first transistor T1. A drain D3 of the third transistor T3 is electrically connected with the drain D1 of the first transistor T1, and a source S3 of the third transistor T3 is electrically connected with the reference node RN. An example in which the third transistor T3 may include a single gate is illustrated, but the third transistor T3 may include gates. In an embodiment, a gate G3 of the third transistor T3 is electrically connected with an i-th scan line GLi in a second group. The fourth transistor T4 is connected between the reference node RN and a first voltage line VL1. A drain D4 of the fourth transistor T4 is electrically connected with the reference node RN, and a source S4 of the fourth transistor T4 is electrically connected with the first voltage line VL1. An example in which the fourth transistor T4 may include a single gate is illustrated, but the fourth transistor T4 may include gates. In an embodiment, a gate G4 of the fourth transistor T4 is electrically connected with an i-th scan line HLi in a third group.

The fifth transistor T5 is electrically connected between the power line PL and the source S1 of the first transistor T1. A source S5 of the fifth transistor T5 is electrically connected with the power line PL, and a drain D5 of the fifth transistor T5 is electrically connected with the source S1 of the first transistor T1. A gate G5 of the fifth transistor T5 is electrically connected with an i-th emission line ELi.

The sixth transistor T6 is electrically connected between the drain D1 of the first transistor T1 and the light emitting device LD. A source S6 of the sixth transistor T6 is electrically connected with the drain D1 of the first transistor T1, and a drain D6 of the sixth transistor T6 is electrically connected with the anode of the light emitting device LD. A gate G6 of the sixth transistor T6 is electrically connected with the i-th emission line ELi. In an embodiment, the gate G6 of the sixth transistor T6 may be connected with a signal line different from that of the gate G5 of the fifth transistor T5.

The seventh transistor T7 is electrically connected between the drain D6 of the sixth transistor T6 and a second voltage line VL2. A source S7 of the seventh transistor T7 is electrically connected with the drain D6 of the sixth transistor T6, and a drain D7 of the seventh transistor T7 is electrically connected with the second voltage line VL2. In an embodiment, a gate G7 of the seventh transistor T7 may be electrically connected with an (i+1)-th scan line SLi+1 in the first group.

However, FIG. 11 shows only the equivalent circuit of the pixel PXij as an example; if necessary, the details such as connection relationships and connection directions of the components of the pixel PXij may be changed.

An operation of the pixel PXij will be described in detail with reference to FIG. 12. Referring to FIG. 12, each of the signals EMi, GIi, GWi, GCi, and GWi+1 may have a high level V-HIGH during a partial period and may have a low level V-LOW during a partial period. The N-type transistor is turned on in case that the corresponding signal has the high level V-HIGH, and the P-type transistor is turned on in case that the corresponding signal has the low level V-LOW.

In case that the emission control signal EMi has the high level V-HIGH, the fifth transistor T5 and the sixth transistor T6 are turned off. In case that the fifth transistor T5 and the sixth transistor T6 are turned off, a current path is not formed between the power line PL and the light emitting device LD. Accordingly, the corresponding period may be defined as a non-emission period.

In case that the scan signal GIi applied to the i-th scan line HLi in the third group has the high level V-HIGH, the fourth transistor T4 is turned on. In case that the fourth transistor T4 is turned on, the reference node RN is initialized with a first initialization voltage Vint.

In case that the scan signal GWi applied to the i-th scan line SLi in the first group has the low level V-LOW and the scan signal GCi applied to the i-th scan line GLi in the second group has the high level V-HIGH, the second transistor T2 and the third transistor T3 are turned on.

Because the reference node RN is initialized with the first initialization voltage Vint, the first transistor T1 is in a state of being turned on. In case that the first transistor T1 is turned on, a voltage corresponding to a data signal Dj (refer to FIG. 11) is provided to the reference node RN. The capacitor Cst stores the voltage corresponding to the data signal Dj. The voltage corresponding to the data signal Dj may be a voltage that is obtained by subtracting a threshold voltage of the first transistor T1 from the data signal Dj.

In case that the scan signal GWi+1 applied to the (i+1)-th scan line SLi+1 in the first group has the low level V-LOW, the seventh transistor T7 is turned on. As the seventh transistor T7 is turned on, the anode of the light emitting device LD is initialized with a second initialization voltage VAint. A parasitic capacitor of the light emitting device LD may be discharged.

In case that the emission control signal EMi has the low level V-LOW, the fifth transistor T5 and the sixth transistor T6 are turned on. In case that the fifth transistor T5 is turned on, the first power supply voltage ELVDD is provided to the first transistor T1. In case that the sixth transistor T6 is turned on, the first transistor T1 and the light emitting device LD are electrically connected. The light emitting device LD generates a light of luminance corresponding to the amount of current thus provided.

Figure 13:
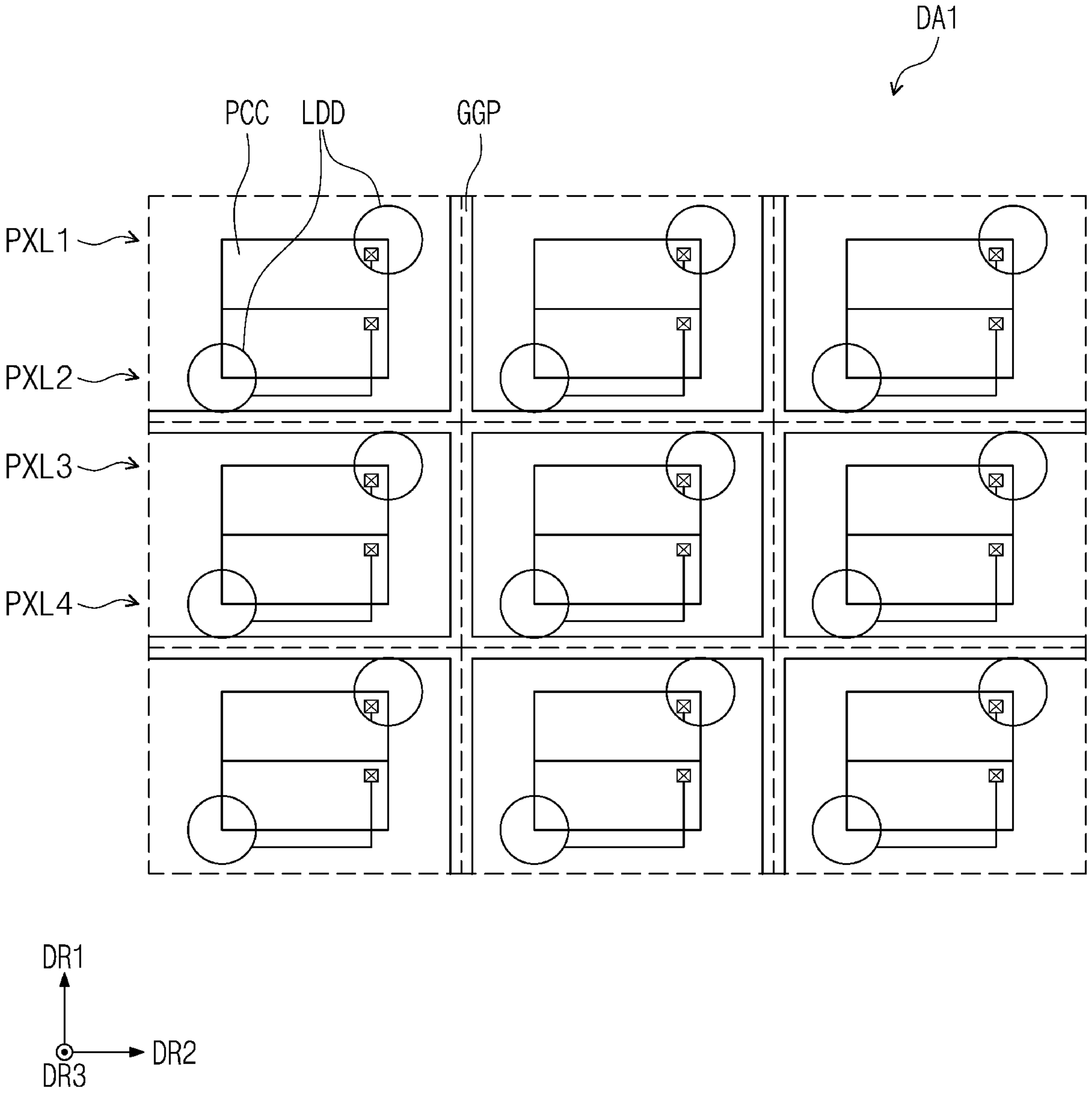
FIG. 13 is an enlarged schematic plan view of a first display area according to an embodiment.
Figure 14:
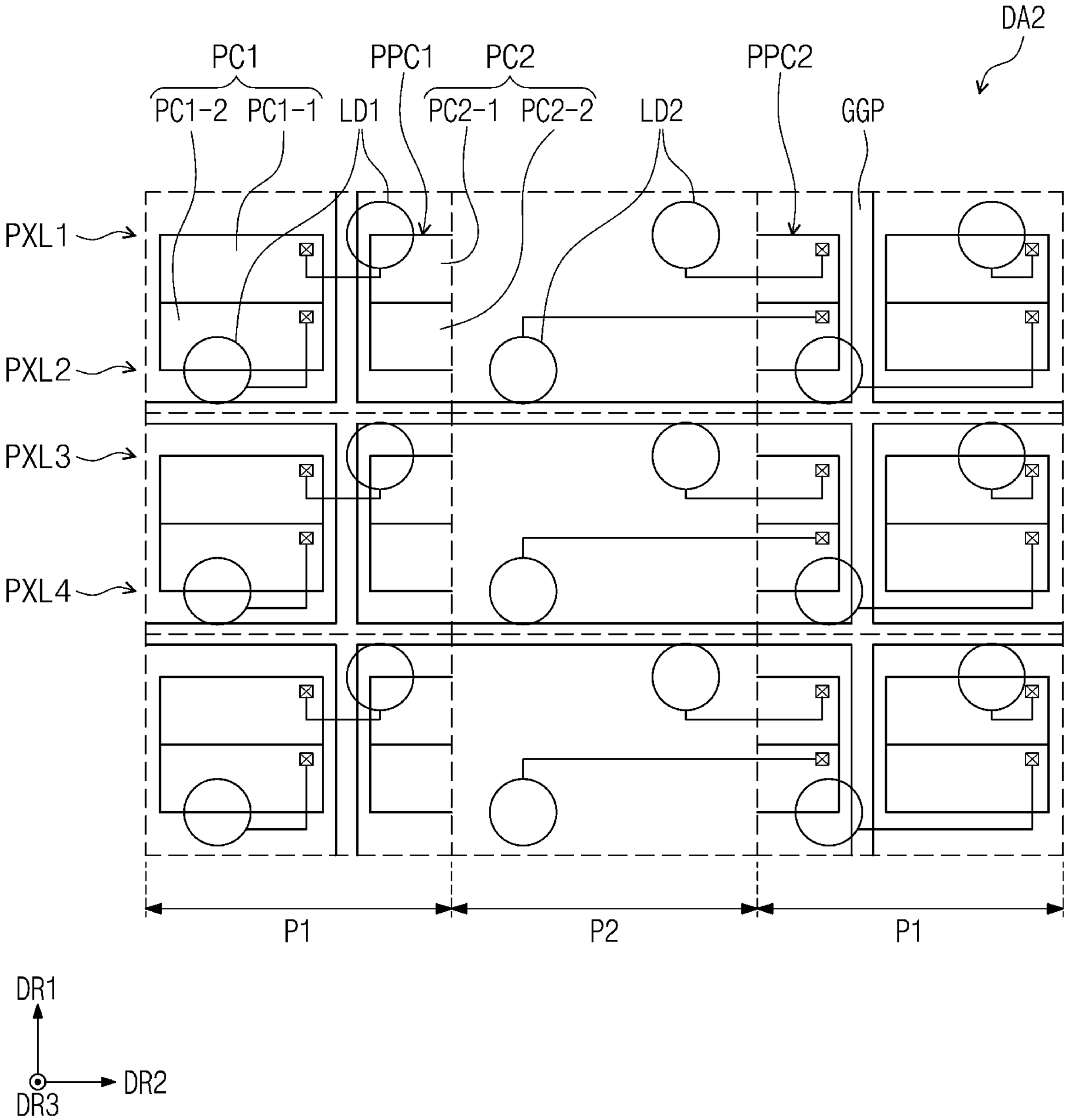
FIG. 14 is an enlarged schematic plan view of a second display area according to an embodiment.

FIG. 13 is an enlarged schematic plan view of the first display area DA1 according to an embodiment, and FIG. 14 is an enlarged schematic plan view of the second display area DA2 according to an embodiment.

A resolution of a display device may be determined by the number of pixels disposed in a reference area, for example, may be measured by the PPI (Pixels Per Inch). In general, a resolution of a light emitting device and a resolution of a pixel circuit are identical to a resolution of a pixel. The reason is that each of pixels may include the light emitting device and the pixel circuit and the light emitting device and the pixel circuit are disposed uniformly over the entire display area DP-DA (refer to FIG. 5).

Referring to FIGS. 13 and 14, the first display area DA1 and the second display area DA2 may have different pixel arrangements. In detail, the first display area DA1 and the second display area DA2 may have the same light emitting device arrangement, but the first display area DA1 and the second display area DA2 may have different pixel circuit arrangements. The expression "the same light emitting device arrangement" may mean that intervals (or distances) between light emitting devices are identical. Also, the expression may mean that light emitting devices have the same color arrangement. Below, the description will be described in detail with reference to FIGS. 13 and 14.

Referring to FIG. 13, first display area pixel circuits (hereinafter referred to as to "first pixel circuit") PCC and first display area light emitting devices (hereinafter referred to as "first display light emitting devices") LDD may be disposed in the first display area DA1. The first pixel circuits PCC and the first display light emitting devices LDD in the first display area DA1 may be uniformly disposed. The first pixel circuit PCC and the first display light emitting device LDD may be electrically connected. The first display light emitting devices LDD may include a red light emitting device, a green light emitting device, and a blue light emitting device. An example in which the red light emitting device, the green light emitting device, and the blue light emitting device have the same area is illustrated in FIG. 13, but the disclosure is not limited thereto. For example, the red light emitting device, the green light emitting device, and the blue light emitting device may have various areas.

Also, anodes of the red light emitting device, the green light emitting device, and the blue light emitting device are representatively illustrated in FIG. 13. The first pixel circuit PCC corresponding to the anode may be connected with the first display light emitting device LDD through a contact hole CH (refer to FIG. 15). This will be described in detail later.

Referring to FIG. 13, the first pixel circuits PCC may be disposed adjacent to each other to form one pixel group. The pixel groups may be disposed to be spaced from each other by a regular interval. However, the arrangement of the first pixel circuits PCC illustrated in FIG. 13 is provided only as an example, but the disclosure is not limited thereto. The first pixel circuits PCC may be disposed to be spaced from each other by a uniform interval in pixel rows PXL1 to PXL4.

The first pixel circuits PCC may have the equivalent circuit illustrated in FIG. 11. In FIG. 13, an area shown by the first pixel circuit PCC simply indicates an area that is occupied by the first to seventh transistors T1 to T7 and the capacitor Cst illustrated in FIG. 11. The first pixel circuits PCC are illustrated to be identical to each other, but the disclosure is not limited thereto. The first pixel circuits PCC may include first-type pixel circuits and second-type pixel circuits, and a pair of a first-type pixel circuit and a second-type pixel circuit may be repeatedly disposed.

The pixel rows PXL1 to PXL4 may be defined in the first display area DA1. The green light emitting devices may be arranged or disposed in each of the first pixel row PXL1 and the third pixel row PXL3 along the second direction DR2, and the red light emitting devices and the blue light emitting devices may be alternately arranged or disposed in the second pixel row PXL2 along the second direction DR2. The blue light emitting devices and the red light emitting devices may be alternately arranged or disposed in the fourth pixel row PXL4 along the second direction DR2.

A separation space GGP that extends along the first direction DR1 and the second direction DR2 may be disposed in an area that does not overlap the first pixel circuits PCC. Herein, the arrangement of the separation space GGP illustrated is provided only as an example; if necessary, various arrangements in which the separation space GGP extends in various directions or separation spaces GGP are disposed to be spaced from each other by a regular interval may be possible. The separation space GGP will be described in detail with reference to FIG. 15.

Referring to FIG. 14, the second display area DA2 may include a first partial area P1 and a second partial area P2. A portion of the first partial area P1 and the second partial areas P2 may be alternately disposed along the second direction DR2. The first partial area P1 may overlap the first extension portions F-C, and the second partial area P2 may be an area that overlaps the opening OP of FIG. 9.

The first partial area P1 may include a first group of pixel circuits, a second group of pixel circuits, and first light emitting devices LD1.

Herein, the first group of pixel circuits PC1-1 and PC1-2 may be a set of pixel circuits that are not separated, with the second partial area P2 interposed therebetween. The case where two pixel circuits PC1-1 and PC1-2 form a pair and pairs are disposed is illustrated in FIG. 14, but the arrangement of the pixel circuits PC1-1 and PC1-2 is not limited thereto. The pixel circuits PC1-1 and PC1-2 may be disposed in various manners, for example, to be spaced from each other by the same interval.

The pixel circuits PC1-1 and PC1-2 that are not separated may constitute a first unit pixel circuit PC1 composed of a pair. Hereinafter, the pixel circuits PC1-1 and PC1-2 may be referred to as a "(1-1)-th pixel circuit PC1-1" and a "(1-2)-th pixel circuit PC1-2". The first unit pixel circuits PC1 may be disposed to be spaced from each other by the same interval in the first partial area P1. The (1-1)-th pixel circuit PC1-1 and the (1-2)-th pixel circuit PC1-2 of the first unit pixel circuit PC1 may be symmetric in structure with respect to a reference line corresponding to the second direction DR2. Although not illustrated in FIG. 14, the (1-1)-th pixel circuit PC1-1 and the (1-2)-th pixel circuit PC1-2 may be symmetric with respect to a reference line corresponding to the first direction DR1.

Each of the (1-1)-th pixel circuit PC1-1 and the (1-2)-th pixel circuit PC1-2 may have the equivalent circuit illustrated in FIG. 11. That is, an area shown by the (1-1)-th pixel circuit PC1-1 and the (1-2)-th pixel circuit PC1-2 simply indicates an area that is occupied by the first to seventh transistors T1 to T7 and the capacitor Cst illustrated in FIG. 11.

Each of the (1-1)-th pixel circuit PC1-1 and the (1-2)-th pixel circuit PC1-2 may be electrically connected with one first light emitting device LD1. Although not illustrated in FIG. 14, each of the (1-1)-th pixel circuit PC1-1 and the (1-2)-th pixel circuit PC1-2 may be electrically connected with one second light emitting device LD2.

The first light emitting devices LD1 electrically connected with the (1-1)-th pixel circuits PC1-1 and the (1-2)-th pixel circuits PC1-2 may extend along the second direction DR2 and may constitute the pixel rows PXL1 to PXL4 arranged or disposed along the first direction DR1. The pixel rows PXL1 to PXL4 may be disposed along the first direction DR1 so as to be spaced from each other by the same interval.

The first light emitting devices LD1 electrically connected with the (1-1)-th pixel circuit PC1-1 may be disposed at a location corresponding to the first pixel row PXL1 or the third pixel row PXL3. The first light emitting devices LD1 disposed at the location corresponding to the first pixel row PXL1 or the third pixel row PXL3 may emit a light of a green color.

The first light emitting devices LD1 electrically connected with the (1-2)-th pixel circuit PC1-2 may be disposed at a location corresponding to the second pixel row PXL2 or the fourth pixel row PXL4. The second light emitting devices LD2 disposed at the location corresponding to the second pixel row PXL2 or the fourth pixel row PXL4 may emit a light of a blue or red color.

However, the locations of the first light emitting devices LD1 are not limited thereto. For example, the connection relationship between the first light emitting devices LD1 and the (1-1)-th pixel circuit PC1-1 and the (1-2)-th pixel circuit PC1-2 may be changed or modified to be disposed at various locations.

The second group of pixel circuits may be a set of pixel circuits PC2-1 and PC2-2 that are separated, with the second partial area P2 interposed therebetween. The case where two pixel circuits PC2-1 and PC2-2 form a pair and pairs are disposed is illustrated in FIG. 14, but the arrangement of the pixel circuits PC2-1 and PC2-2 is not limited thereto. The pixel circuits PC2-1 and PC2-2 may be disposed in various manners, for example, to be spaced from each other by the same interval.

The pixel circuits PC2-1 and PC2-2 that are separated, with the second partial area P2 interposed therebetween may constitute a second unit pixel circuit PC2 composed of a pair. Hereinafter, the pixel circuits PC2-1 and PC2-2 may be referred to as a "(2-1)-th pixel circuit PC2-1" and a "(2-2)-th pixel circuit PC2-2". The second unit pixel circuits PC2 may be disposed to be spaced from each other by the same interval in the first partial area P1. The (2-1)-th pixel circuit PC2-1 and the (2-2)-th pixel circuit PC2-2 of the second unit pixel circuit PC2 may be symmetric in structure with respect to the reference line corresponding to the second direction DR2. Although not illustrated in FIG. 14, the (2-1)-th pixel circuit PC2-1 and the (2-2)-th pixel circuit PC2-2 may be symmetric with respect to the reference line corresponding to the first direction DR1.

Each of the (2-1)-th pixel circuit PC2-1 and the (2-2)-th pixel circuit PC2-2 may be electrically connected with one second light emitting device LD2. Although not illustrated in FIG. 14, in case that the arrangement of the light emitting devices LD1 and LD2 is different from that of FIG. 14, each of the (2-1)-th pixel circuit PC2-1 and the (2-2)-th pixel circuit PC2-2 may be electrically connected with one first light emitting device LD1.

The second light emitting devices LD2 electrically connected with the (2-1)-th pixel circuits PC2-1 and the (2-2)-th pixel circuits PC2-2 may extend along the second direction DR2 and may constitute the pixel rows PXL1 to PXL4 arranged or disposed along the first direction DR1.

The second light emitting devices LD2 electrically connected with the (2-1)-th pixel circuit PC2-1 may be disposed at a location corresponding to the first pixel row PXL1 or the third pixel row PXL3. The second light emitting devices LD2 disposed at the location corresponding to the first pixel row PXL1 or the third pixel row PXL3 may emit a light of a green color.

The second light emitting devices LD2 electrically connected with the (2-2)-th pixel circuit PC2-2 may be disposed at a location corresponding to the second pixel row PXL2 or the fourth pixel row PXL4. The second light emitting devices LD2 disposed at the location corresponding to the second pixel row PXL2 or the fourth pixel row PXL4 may emit a light of a blue or red color.

However, the locations of the second light emitting devices LD2 are not limited thereto. For example, the connection relationship between the second light emitting devices LD2 and the (2-1)-th pixel circuit PC2-1 and the (2-2)-th pixel circuit PC2-2 may be changed or modified to be disposed at various locations.

The (2-1)-th pixel circuit PC2-1 and the (2-2)-th pixel circuit PC2-2 may respectively include a first partial circuit PPC1 and a second partial circuit PPC2. The first partial circuit PPC1 and the second partial circuit PPC2 may be adjacent to each other, with the corresponding second partial area P2 interposed therebetween. The first partial circuit PPC1 and the second partial circuit PPC2 may be electrically connected to operate as one pixel circuit. That is, each of the (2-1)-th pixel circuit PC2-1 and the (2-2)-th pixel circuit PC2-2 may be divided and disposed into the first partial circuit PPC1 and the second partial circuit PPC2.

As such, even in the case where only a narrow area is present in the first partial area P1 after the pixel circuits PC1-1 and PC1-2 are disposed, a resolution of a pixel circuit may be improved by disposing the partial circuits PPC1 and PPC2, not one complete pixel circuit PC1-1/PC1-2. Also, because the width of the first partial area P1 does not need to be an integer multiple of the pitch of the pixel circuit PC1-1/PC1-2, the degree of freedom may be secured in the design of the first partial area P1.

The second partial area P2 may include only the second light emitting device LD2 electrically connected with the first unit pixel circuit PC1 or the second unit pixel circuit PC2. That is, a pixel circuit may not be disposed in the second partial area P2. Because the second partial area P2 that overlaps the opening OP of FIG. 9 is low in impact resistance, a circuit may be short-circuited or opened by the external impact. Accordingly, the pixel circuit may not be disposed in the second partial area P2 such that the defect of the pixel circuit decreases.

Referring to FIGS. 13 and 14, the resolution of the pixel circuits PCC in the first display area DA1 and the resolution of the pixel circuits PC1 and PC2 in the second display area DA2 may be different from each other. In detail, the resolution of the pixel circuits PC1 and PC2 in the second display area DA2 may be greater than the resolution of the pixel circuits PCC in the first display area DA1. The reason is that unlike the first display area DA1 in which a ratio of light emitting devices to pixel circuits is 1:1, in the case of the second display area DA2, the pixel circuit connected with the second light emitting device LD2 of the second display area DA2 is disposed in the first partial area P1.

The resolution of the light emitting device in the first display area DA1 may be substantially identical to the resolution of the light emitting device in the second display area DA2. Also, the resolution of the first light emitting device LD1 in the first partial area P1 may be substantially identical to the resolution of the second emitting device LD2 in the second partial area P2. As such, an image of the same resolution may be provided over the entire display area DP-DA (refer to FIG. 4).

The resolution of the light emitting device in the first display area DA1 and the resolution of the light emitting device in the second display area DA2 may be smaller than the resolution of the pixel circuit in the first partial area P1. The reason is that the pixel circuit of the first partial area P1 is integrated and is electrically connected with the second light emitting device LD2 of the second partial area P2, not the first partial area P1.

The separation space GGP that extends along the first direction DR1 and the second direction DR2 may be disposed in an area that does not overlap the first unit pixel circuit PC1 and the second unit pixel circuit PC2. Herein, the arrangement of the separation space GGP illustrated is provided only as an example; if necessary, various arrangements in which the separation space GGP extends in various directions or separation spaces GGP are disposed to be spaced from each other by a regular interval may be possible.

Figure 15:
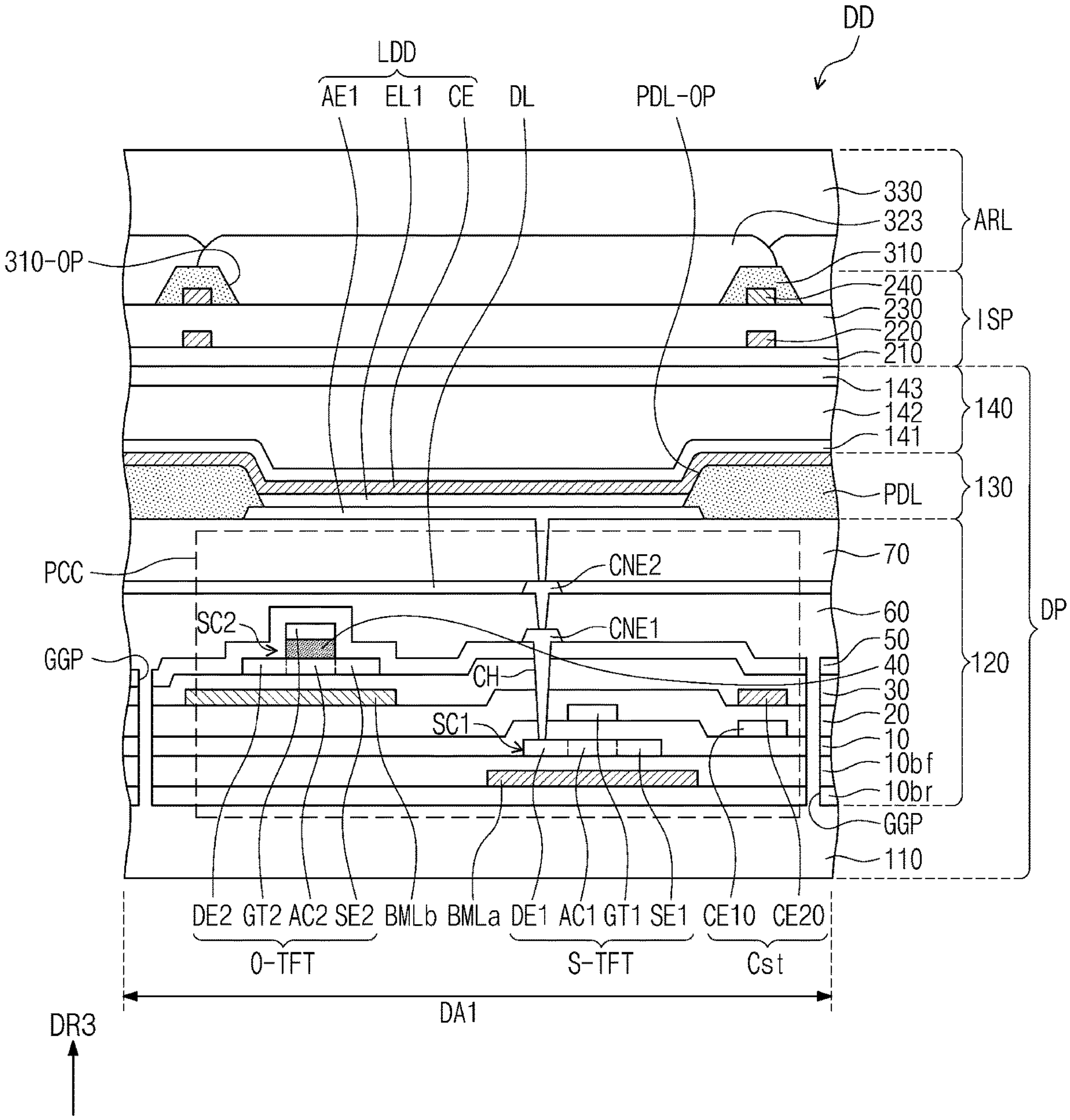
FIG. 15 is a schematic cross-sectional view of a first display area according to an embodiment.
Figure 16:
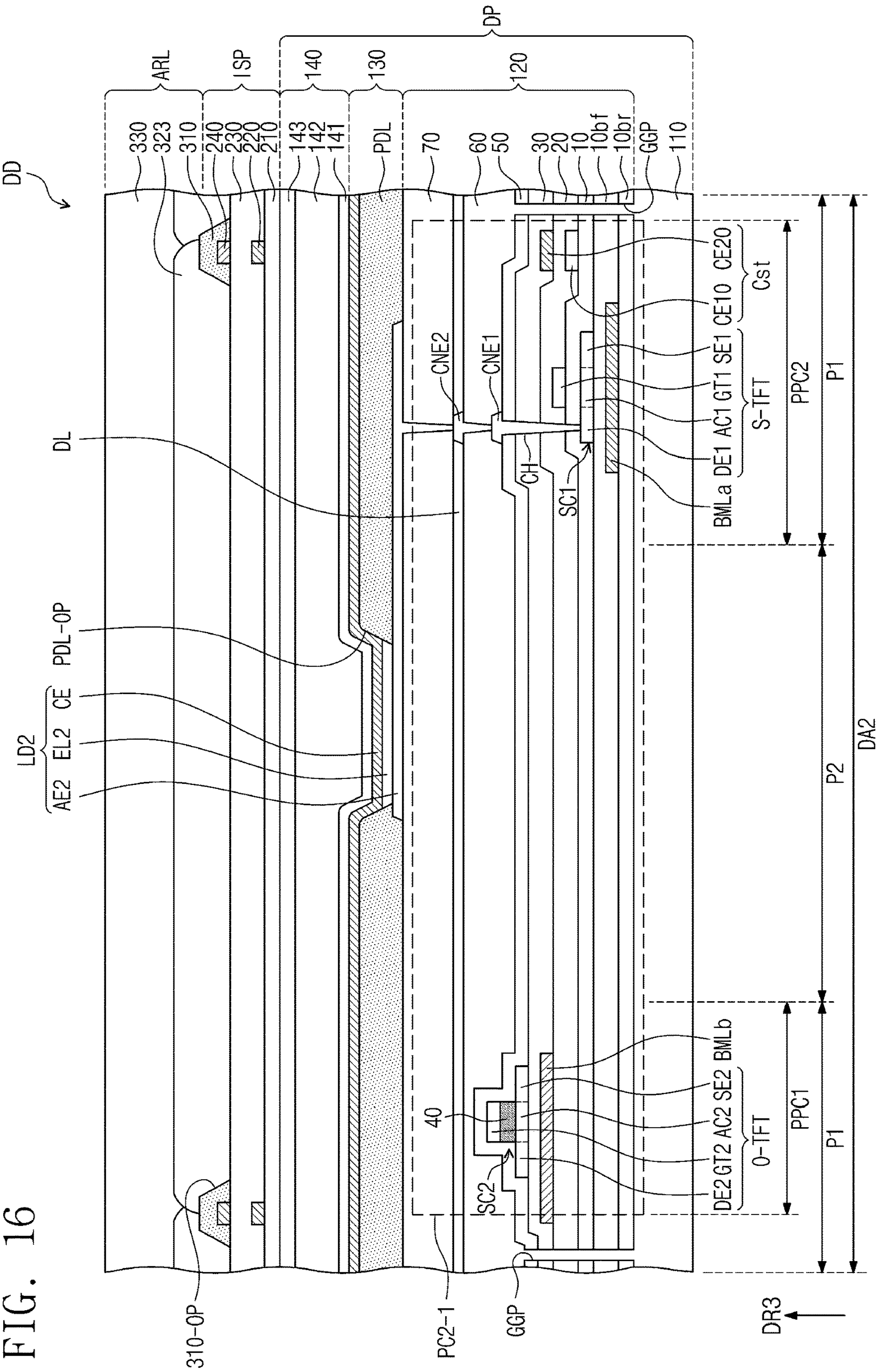
FIG. 16 is a schematic cross-sectional view of first and second partial areas according to an embodiment.

FIG. 15 is a schematic cross-sectional view of the first display area DA1 according to an embodiment, and FIG. 16 is a schematic cross-sectional view of the first partial area P1 and the second partial area P2 according to an embodiment.

The first display light emitting device LDD and a silicon transistor S-TFT and an oxide transistor O-TFT of the first pixel circuit PCC described with reference to FIG. 13 are illustrated in FIG. 15. In the equivalent circuit illustrated in FIG. 11, the third and fourth transistors T3 and T4 may be implemented with the oxide transistor O-TFT, and the remaining transistors may be implemented with the silicon transistor S-TFT. A portion of the second unit pixel circuit PC2 and a portion of the second light emitting device LD2 are illustrated in FIG. 16.

Referring to FIG. 15, a barrier layer 10*br* may be disposed on the base layer 110. The barrier layer 10*br* prevents foreign objects from being introduced from the outside. The barrier layer 10*br* may include at least one inorganic layer. The barrier layer 10*br* may include a silicon oxide layer and a silicon nitride layer. Each of the silicon oxide layer and the silicon nitride layer may include layers, and the silicon oxide layers and the silicon nitride layers may be alternately stacked each other.

A first shielding electrode BMLa may be disposed on the barrier layer 10*br*. The first shielding electrode BMLa may include metal. The first shielding electrode BMLa may include molybdenum (Mo), an alloy containing molybdenum, titanium (Ti), or an alloy containing titanium, which has good heat resistance. The first shielding electrode BMLa may receive a bias voltage. The first shielding electrode BMLa may receive the first power supply voltage ELVDD. The first shielding electrode BMLa may prevent an electrical potential due to a polarization phenomenon from affecting the silicon transistor S-TFT. The first shielding electrode BMLa may prevent an external light from being incident onto the silicon transistor S-TFT. In an embodiment, the first shielding electrode BMLa may be a floating electrode that is isolated from any other electrode or wire.

A buffer layer 10*bf* may be disposed on the barrier layer 10*br*. The buffer layer 10*bf* may prevent metal atoms or impurities from being diffused from the base layer 110 to a first semiconductor pattern SC1 on the upper side thereof. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. For example, the silicon semiconductor may include amorphous silicon or polycrystalline silicon. For example, the first semiconductor pattern SC1 may include low-temperature polycrystalline silicon (LTPS).

FIG. 15 shows only a portion of the first semiconductor pattern SC1, and the first semiconductor pattern SC1 may be further disposed in any other area. The first semiconductor patterns SC1 may be arranged or disposed over pixels in compliance with a selected or given rule. An electrical property of the first semiconductor pattern SC1 may vary depending on whether it is doped. The first semiconductor pattern SC1 may include a first area whose conductivity is high and a second area whose conductivity is low. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped at a lower concentration than the first area.

The conductivity of the first area may be higher than the conductivity of the second area, and the first area may substantially serve as an electrode or a signal line. The second area may substantially correspond to a channel region (or an active region) of a transistor. In other words, a portion of the first semiconductor pattern SC1 may be a channel of a transistor, another portion thereof may be a source or a drain of the transistor, and the other portion thereof may be a connection electrode or a connection signal line.

A source region SE1, a channel region (or an active region) AC1, and a drain region DE1 of the silicon transistor S-TFT may be formed from the first semiconductor pattern SC1. The source region SE1 and the drain region DE1 of the silicon transistor S-TFT may extend from the channel area AC1 in directions, which are opposite to each other, in a schematic cross-sectional view.

A first insulating layer 10 may be disposed on the buffer layer 10*bf*. The first insulating layer 10 may cover the first semiconductor pattern SC1. The first insulating layer 10 may be an inorganic layer. The first insulating layer 10 may be a single silicon oxide layer. As well as the first insulating layer 10, the circuit layer 120 to be described later may include an inorganic layer of a single-layer or multi-layer structure and may include at least one of the above materials, but the disclosure is not limited thereto.

A gate electrode GT1 of the silicon transistor S-TFT is disposed on the first insulating layer 10. The gate GT1 may be a portion of a metal pattern. The gate GT1 overlaps the active region AC1. The gate GT1 may be used as a mask in the process of doping the first semiconductor pattern SC1. The first electrode CE10 of the storage capacitor Cst is disposed on the first insulating layer 10. Unlike the illustration of FIG. 15, the first electrode CE10 may have an integral shape with the gate GT1.

A second insulating layer 20 may be disposed on the first insulating layer 10 to cover the gate GT1. Although not illustrated, an upper electrode that overlaps the gate GT1 may be disposed on the second insulating layer 20. The second electrode CE20 that overlaps the first electrode CE10 may be disposed on the second insulating layer 20.

A second shielding electrode BMLb is disposed on the second insulating layer 20. The second shielding electrode BMLb may be disposed to correspond to a lower portion of the oxide transistor O-TFT. In an embodiment, the second shielding electrode BMLb may be omitted. According to an embodiment, the first shielding electrode BMLa may extend to the lower portion of the oxide transistor O-TFT so as to be disposed under or below the oxide transistor O-TFT and thus may replace the second shielding electrode BMLb.

A third insulating layer 30 may be disposed on the second insulating layer 20. A second semiconductor pattern SC2 may be disposed on the third insulating layer 30. The second semiconductor pattern SC2 may include a channel region AC2 of the oxide transistor O-TFT. The second semiconductor pattern SC2 may include an oxide semiconductor. The second semiconductor pattern SC2 may include transparent conductive oxide (TCO) such as indium tin oxide (ITO), indium zinc oxide (IZO), indium gallium zinc oxide (IGZO), zinc oxide (ZnOx), or indium oxide ($In_2O_3$).

The oxide semiconductor may include regions that are distinguished depending on whether the transparent conductive oxide is reduced. A region (hereinafter referred to as a "reduction region") in which the transparent conductive oxide is reduced has greater conductivity than a region (hereinafter referred to as a "non-reduction region") in which the transparent conductive oxide is not reduced. The reduction region may substantially serve as a source or drain of a transistor or a signal line. The non-reduction region substantially corresponds to a semiconductor region (or a channel) of a transistor. In other words, a portion of the second semiconductor pattern SC2 may be a semiconductor region of a transistor, another portion thereof may be a source region or drain region of the transistor, and the other portion thereof may be a signal transfer region.

A fourth insulating layer 40 may be disposed on the third insulating layer 30. As illustrated in FIG. 15, the fourth insulating layer 40 may be an insulating pattern that overlaps a gate GT2 of the oxide transistor O-TFT and exposes a source region SE2 and a drain region DE2 of the oxide transistor O-TFT. In an embodiment. The fourth insulating layer 40 may overlap pixels in common and may cover the second semiconductor pattern SC2.

The gate GT2 of the oxide transistor O-TFT is disposed on the fourth insulating layer 40. The gate GT2 of the oxide transistor O-TFT may be a portion of a metal pattern. The gate GT2 of the oxide transistor O-TFT overlaps the active region AC2.

A fifth insulating layer 50 may be disposed on the fourth insulating layer 40, and the fifth insulating layer 50 may cover the gate GT2. Each of the first insulating layer 10 to the fifth insulating layer 50 may be an inorganic layer.

The separation space GGP penetrating at least one or more of the first to fifth insulating layers 10 to 50, the buffer layer 10*bf*, and the barrier layer 10*br* may be defined in the first display area DA1 of the display panel DP. The separation space GGP may not overlap the first pixel circuit PCC in a plan view. The separation space GGP may prevent the impact from being transferred through the first to fifth insulating layers 10 to 50.

A first connection electrode CNE1 may be disposed on the fifth insulating layer 50. The first connection electrode CNE1 may be connected with the drain region DE1 of the silicon transistor S-TFT through the contact hole CH penetrating the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected with the first connection electrode CNE1 through a contact hole CH penetrating the sixth insulating layer 60. A data line DL may be disposed on the sixth insulating layer 60. A seventh insulating layer 70 may be disposed on the sixth insulating layer 60 and may cover the second connection electrode CNE2 and the data line DL. Each of the sixth insulating layer 60 and the seventh insulating layer 70 may be an organic layer.

The first display light emitting device LDD may include an anode (or a first electrode) AE1, an emission layer EL1, and a cathode (or a second electrode) CE. The cathode CE of each of the first light emitting device LD1 and the second light emitting device LD2 may have an integral shape with the cathode CE of the first display light emitting device LDD. That is, the cathode CE may be provided in common in the first display light emitting device LDD, the first light emitting device LD1, and the second light emitting device LD2.

The anode AE1 of the first display light emitting device LDD may be disposed on the seventh insulating layer 70. The anode AE1 may be a (semi) light-transmitting electrode or a reflective electrode. A pixel defining layer PDL may be disposed on the seventh insulating layer 70. The pixel defining layer PDL may include the same material or similar material and may be formed through the same process. The pixel defining layer PDL may have a property of absorbing a light. For example, the pixel defining layer PDL may have a black color. The pixel defining layer PDL may include a black coloring agent. The black coloring agent may include a black dye and a black pigment. The black coloring agent may include metal such as carbon black or chrome or an oxide thereof. The pixel defining layer PDL may correspond to a light blocking pattern having a light blocking characteristic.

The pixel defining layer PDL may cover a portion of the anode AE1. For example, an opening PDL-OP that exposes a portion of the anode AE1 may be defined in the pixel defining layer PDL.

Although not illustrated, a hole control layer may be disposed between the anode AE land the emission layer ELL The hole control layer may include a hole transport layer and may further include a hole injection layer. An electron control layer may be disposed between the emission layer EL1 and the cathode CE. The electron control layer may include an electron transport layer and may further include an electron injection layer. The hole control layer and the electron control layer may be formed in common in the pixels PX (refer to FIG. 5) by using an open mask.

The encapsulation layer 140 may be disposed on the light emitting device layer 130. The encapsulation layer 140 may include an inorganic layer 141, an organic layer 142, and an inorganic layer 143 that may be sequentially stacked each other, but the layers constituting the encapsulation layer 140 are not limited thereto.

The inorganic layers 141 and 143 may protect the light emitting device layer 130 from moisture and oxygen, and the organic layer 142 may protect the light emitting device layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acryl-based organic layer, but the disclosure is not limited thereto.

The input sensor ISP may be disposed on the display panel DP. The input sensor ISP may include at least one conductive layer and at least one insulating layer. In an embodiment, the input sensor ISP may include a first insulating layer 210, a first conductive layer 220, a second insulating layer 230, and a second conductive layer 240.

The first insulating layer 210 may be disposed on or may be directly disposed on the display panel DP. The first insulating layer 210 may be an inorganic layer including at least one of silicon nitride, silicon oxynitride, and silicon oxide. Each of the first conductive layer 220 and the second conductive layer 240 may have a single-layer structure or may have a multi-layer structure in which layers may be stacked each other along the third direction DR3. The first conductive layer 220 and the second conductive layer 240 may include conductive lines defining an electrode of a mesh shape. The conductive line of the first conductive layer 220 and the conductive line of the second conductive layer 240 may be connected with through a contact hole penetrating the second insulating layer 230 or may not be connected with each other. A connection relationship between the conductive line of the first conductive layer 220 and the conductive line of the second conductive layer 240 may be determined depending on a kind of a sensor implemented with the input sensor ISP.

Each of the first conductive layer 220 and the second conductive layer 240 that have a single-layer structure may include a metal layer or a transparent conductive layer. The metal layer may include molybdenum, silver, titanium, copper, aluminum, or the alloy thereof. The transparent conductive layer may include a transparent conductive oxide such as indium tin oxide (ITO), indium zinc oxide (IZO), zinc oxide (ZnOx), or indium zinc tin oxide (IZTO). The transparent conductive layer may include conductive polymer such as PEDOT, metal nanowire, or graphene.

Each of the first conductive layer 220 and the second conductive layer 240 that have a multi-layer structure may include metal layers. The metal layers may have, for example, a three-layer structure of titanium/aluminum/titanium. The conductive layer of the multi-layer structure may include at least one metal layer and at least one transparent conductive layer. The second insulating layer 230 may be disposed between the first conductive layer 220 and the second conductive layer 240.

The anti-reflection layer ARL may be disposed on the input sensor ISP. The anti-reflection layer ARL may include a division layer 310, a color filter 323, and a planarization layer 330.

A material forming the division layer 310 is not particularly limited as long as it is a material that absorbs a light. The division layer 310 may be a layer having a black color; in an embodiment, the division layer 310 may include a black coloring agent. The black coloring agent may include a black dye and a black pigment. The black coloring agent may include metal such as carbon black or chrome or an oxide thereof.

The division layer 310 may cover the second conductive layer 240 of the input sensor ISP. The division layer 310 may prevent reflection of the external light by the second conductive layer 240. An opening 310-OP may be defined in the division layer 310. The opening 310-OP may overlap the anode AE1. The color filter 323 may overlap the opening 310-OP. The color filter 323 may contact the division layer 310.

The planarization layer 330 may cover the division layer 310 and the color filter 323. The planarization layer 330 may include an organic material and may provide a flat surface on an upper surface of the planarization layer 330. In an embodiment, the planarization layer 330 may be omitted.

The cross section of the second display area DA2 may be understood from FIG. 16. The description of the same components as those described in FIG. 15 may be omitted.

The (2-1)-th pixel circuit PC2-1 of the second partial area P2 may be divided into the first partial circuit PPC1 and the second partial circuit PPC2, with the second partial area P2 interposed therebetween.

An anode AE2 of the second light emitting device LD2 of the second partial area P2 is electrically connected with the second partial circuit PPC2 of the (2-1)-th pixel circuit PC2-1 disposed in the first partial area P1. The anode AE2 of the second light emitting device LD2 may be electrically connected with the silicon transistor S-TFT. The anode AE2 of the second light emitting device LD2 may be electrically connected with the second unit pixel circuit PC2 through the connection electrodes CNE1 and CNE2. A second light emitting layer EL2 may be disposed between the anode AE2 and the cathode CE.

The separation space GGP penetrating at least one or more of the first to fifth insulating layers 10 to 50, the buffer layer 10*bf*, and the barrier layer 10*br* may be defined in the second display area DA2 of the display panel DP. The separation space GGP may not overlap the (2-1)-th pixel circuit PC2-1 in a plan view. The separation space GGP may prevent the impact from being transferred through the first to fifth insulating layers 10 to 50.

Figure 17:
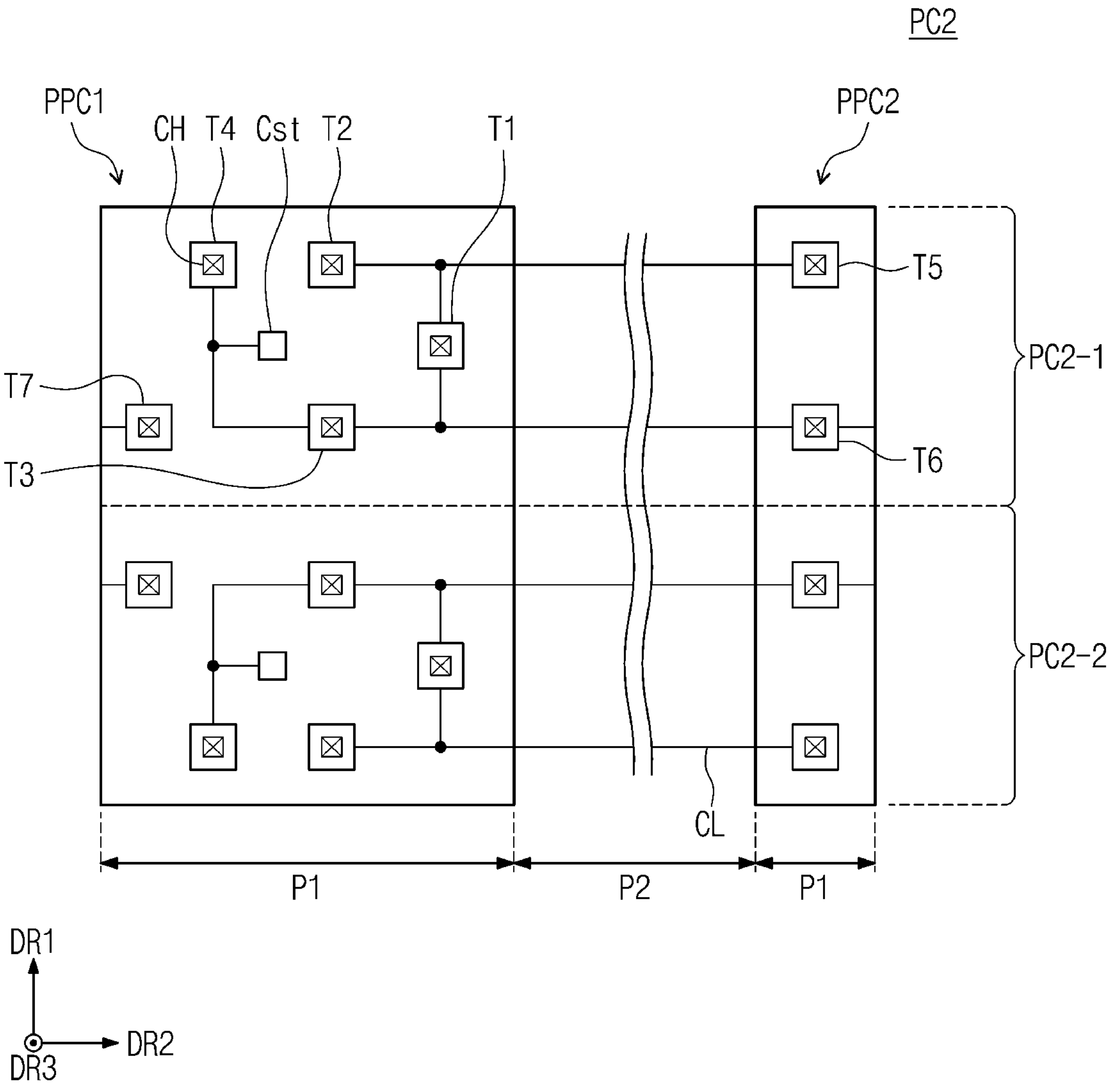
FIG. 17 is a schematic plan view illustrating a configuration of a second unit pixel circuit of FIG. 14.
Figure 18:
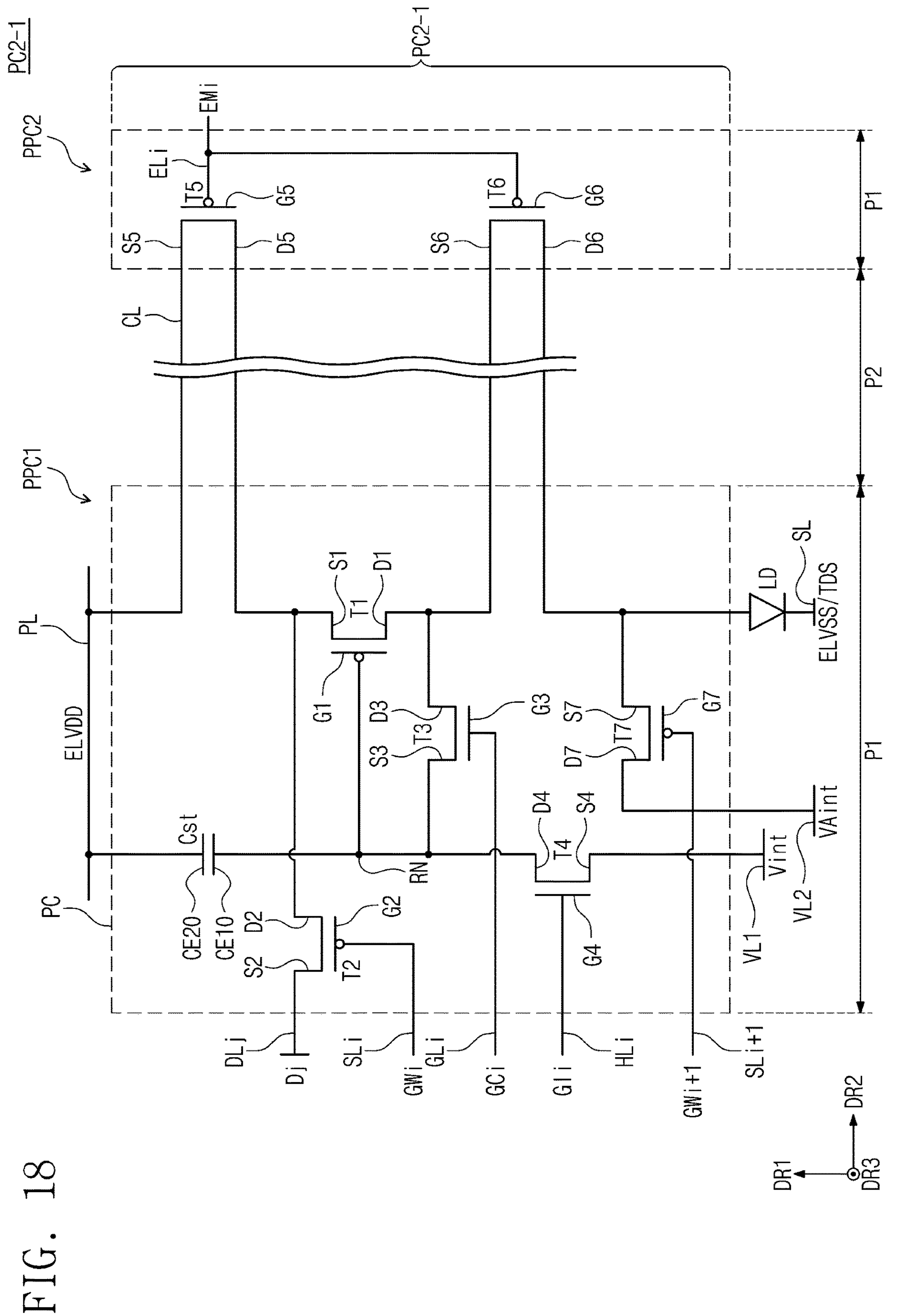
FIG. 18 is a schematic diagram of an equivalent circuit diagram of a (2-1)-th pixel circuit of FIG. 17.

FIG. 17 is a schematic plan view illustrating a configuration of the second unit pixel circuit PC2 of FIG. 13, and FIG. 18 is a schematic diagram of an equivalent circuit diagram of the (2-1)-th pixel circuit PC2-1 of FIG. 16.

Referring to FIG. 17, each of the second unit pixel circuits PC2 may include the first to seventh transistors T1 to T7 and the capacitor Cst. Contact holes CH that respectively correspond to the first to seventh transistors T1 to T7 may be defined in the second unit pixel circuit PC2. An example in which the contact holes CH overlap the first to seventh transistors T1 to T7 is illustrated in FIG. 17, but the locations of the contact holes CH are not limited thereto. For example, the contact holes CH may be defined at various locations so as not to overlap the first to seventh transistors T1 to T7 in a plan view.

The first to seventh transistors T1 to T7 and the capacitor Cst may be connected by connection lines CL. The connection lines CL may electrically connect the first partial circuit PPC1 and the second partial circuit PPC2. Like the connection line CL connecting the fifth transistor T5 and the first transistor T1 of FIG. 17 from among the connection lines CL, the connection line CL connecting the first partial circuit PPC1 with a transistor disposed in each of the second partial circuits PPC2 may overlap the second partial area P2 in a plan view.

The arrangement and the mutual connection relationship of the first to seventh transistors T1 to T7 and the capacitor Cst in FIG. 17 are provided only as an example and may be variously changed or modified.

At least some or a number of the first to seventh transistors T1 to T7 may be disposed in the first partial circuit PPC1, and the others of the first to seventh transistors T1 to T7 may be disposed in the second partial circuit PPC2. At least some or a number of the contact holes CH may be disposed in the first partial circuit PPC1, and the others of the contact holes CH may be disposed in the second partial circuit PPC2.

As illustrated in FIG. 17, the first to fourth transistors T1 to T4 and the seventh transistor T7 may be disposed in the first partial circuit PPC1, and the fifth transistor T5 and the sixth transistor T6 may be disposed in the second partial circuit PPC2. Because a transistor disposed in the first partial circuit PPC1 and a transistor disposed in the second partial circuit PPC2 are electrically connected by the connection line CL, the first partial circuit PPC1 and the second partial circuit PPC2 may operate as one pixel circuit.

The equivalent circuit of the (2-1)-th pixel circuit PC2-1 according to an embodiment may be understood from FIG. 18. A structure and a connection relationship of the equivalent circuit are described with reference to FIG. 11, and thus, additional description associated with the same structure and connection relationship may be omitted to avoid redundancy.

The (2-1)-th pixel circuit PC2-1 has the same configuration as the remaining pixel circuits but is different from the remaining pixel circuits in that the fifth transistor T5 and the sixth transistor T6 are located or disposed in the second partial circuit PPC2 so as to be spaced from the remaining transistors disposed in the first partial circuit PPC1.

A line connecting the source S5 of the fifth transistor T5 and the power line PL and a line connecting the drain D5 of the fifth transistor T5 and the source S1 of the first transistor T1 may extend across the second partial area P2 along the second direction DR2.

A line connecting the source S6 of the sixth transistor T6 and the drain D1 of the first transistor T1 and a line connecting the drain D6 of the sixth transistor T6 and the anode of the light emitting device LD may extend across the second partial area P2 along the second direction DR2.

Figure 19:
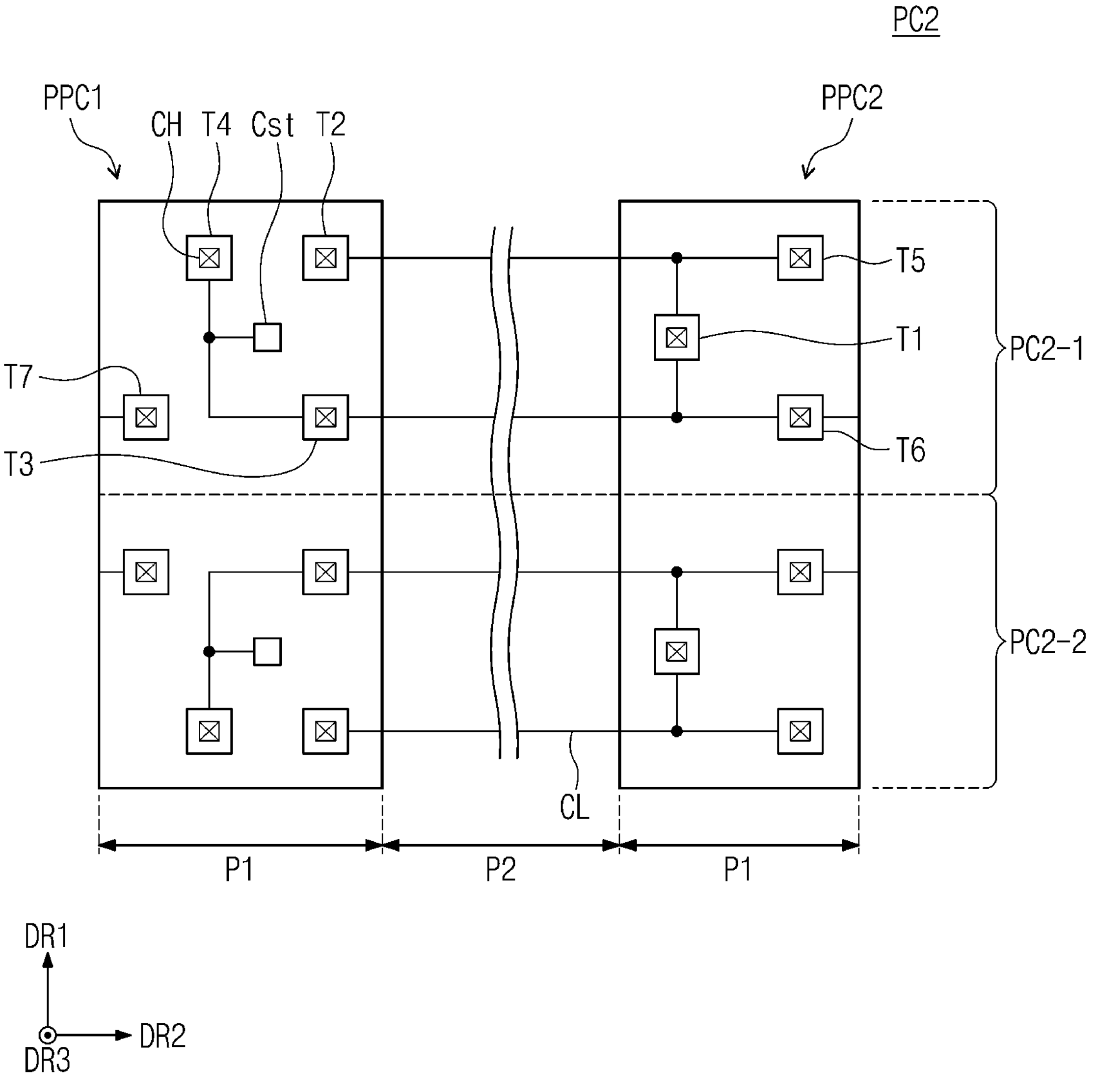
FIG. 19 is a schematic plan view illustrating a configuration of a second unit pixel circuit according to an embodiment.
Figure 20:
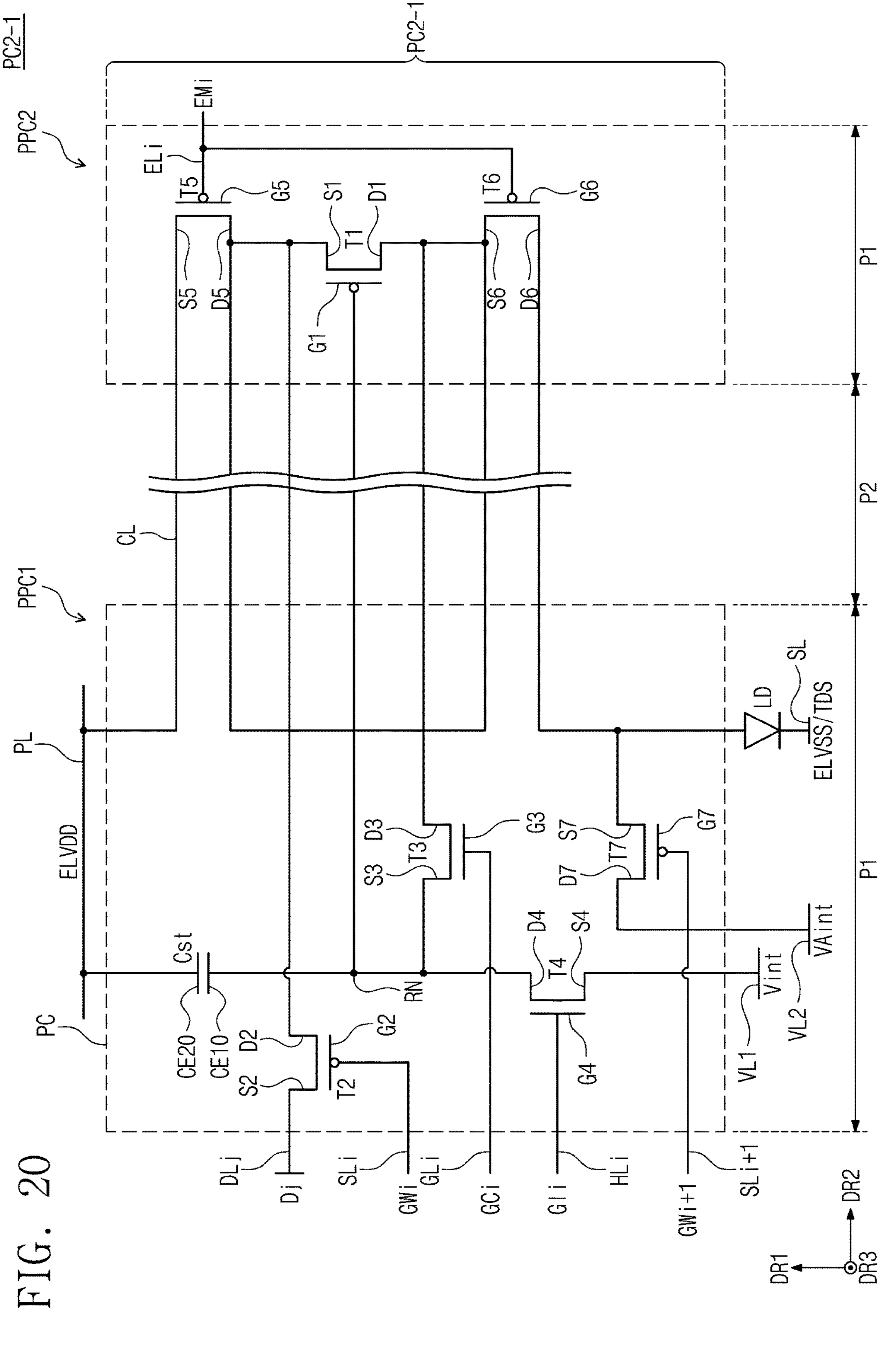
FIG. 20 is a schematic diagram of an equivalent circuit diagram of a (2-1)-th pixel circuit of FIG. 19.

FIG. 19 is a schematic plan view illustrating a configuration of the second unit pixel circuit PC2 according to an embodiment, and FIG. 20 is a schematic diagram of an equivalent circuit diagram of the (2-1)-th pixel circuit PC2-1 of FIG. 19.

As illustrated in FIG. 19, the second to fourth transistors T2 to T4 and the seventh transistor T7 may be disposed in the first partial circuit PPC1, and the first transistor T1, the fifth transistor T5, and the sixth transistor T6 may be disposed in the second partial circuit PPC2. Because a transistor disposed in the first partial circuit PPC1 and a transistor disposed in the second partial circuit PPC2 are electrically connected by the connection line CL, the first partial circuit PPC1 and the second partial circuit PPC2 may operate as one pixel circuit.

The equivalent circuit of the (2-1)-th pixel circuit PC2-1 according to an embodiment may be understood from FIG. 20. A structure and a connection relationship of the equivalent circuit are described with reference to FIG. 11, and thus, additional description associated with the same structure and connection relationship may be omitted to avoid redundancy.

The (2-1)-th pixel circuit PC2-1 has the same configuration as the remaining pixel circuits but is different from the remaining pixel circuits in that the first transistor T1, the fifth transistor T5, and the sixth transistor T6 are located or disposed in the second partial circuit PPC2 so as to be spaced from the remaining transistors disposed in the first partial circuit PPC1.

A portion of line connecting the source S1 of the first transistor T1 and the drain D2 of the second transistor T2 and a portion of line connecting the drain D1 of the first transistor T1 and the drain D3 of the third transistor T3 may extend across the second partial area P2 along the second direction DR2.

A portion of line connecting the source S5 of the fifth transistor T5 and the power line PL and a portion of line connecting the drain D5 of the fifth transistor T5 and the source S6 of the sixth transistor T6 may extend across the second partial area P2 along the second direction DR2.

A portion of line connecting the source S6 of the sixth transistor T6 and the drain D5 of the fifth transistor T5 and a portion of line connecting the drain D6 of the sixth transistor T6 and the anode of the light emitting device LD may extend across the second partial area P2 along the second direction DR2.

Figure 21:
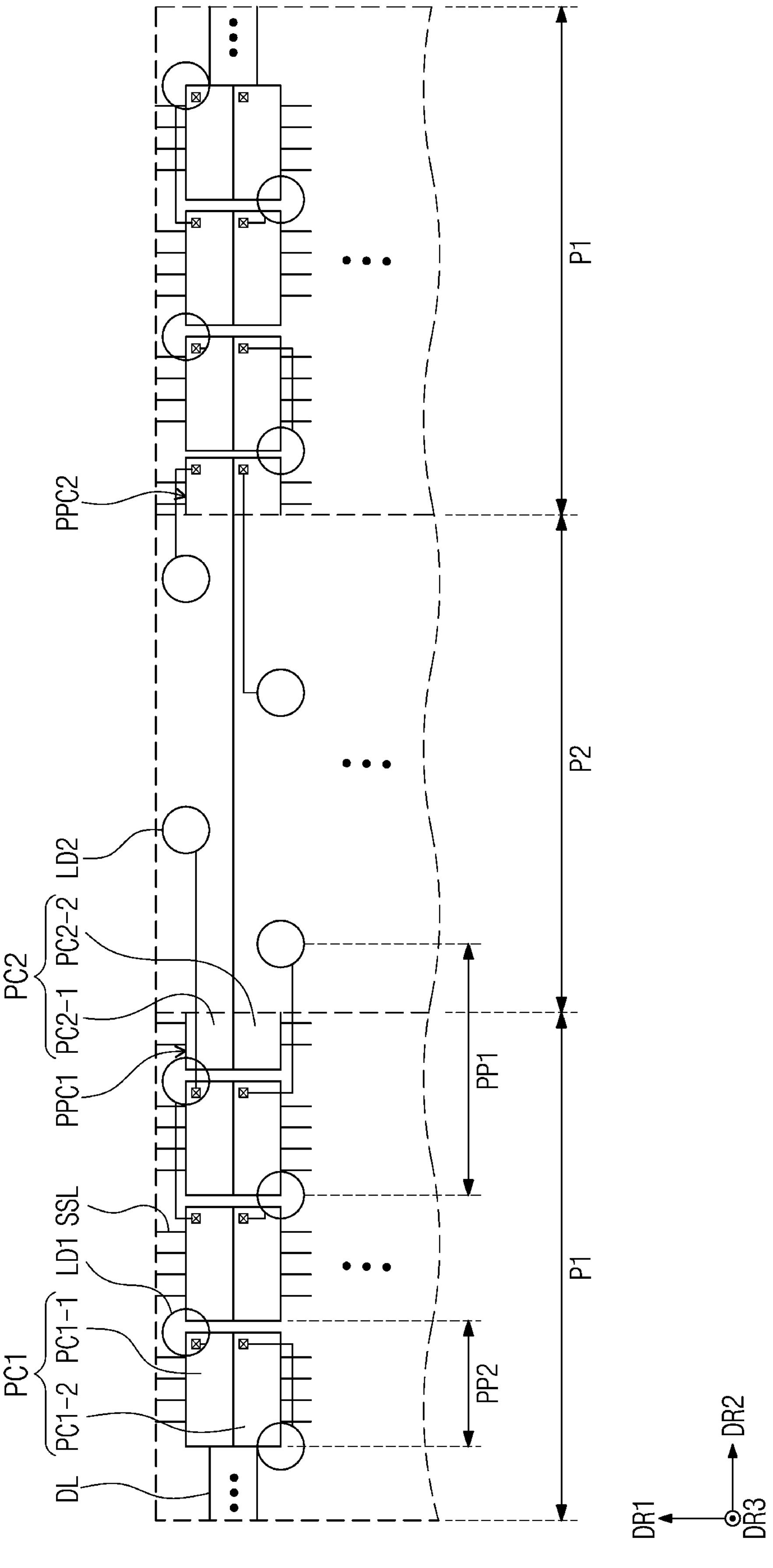
FIG. 21 is an enlarged schematic plan view of a first partial area and a second partial area according to an embodiment.

FIG. 21 is an enlarged schematic plan view of the first partial area P1 and the second partial area P2 according to an embodiment.

Referring to FIG. 21, the first unit pixel circuits PC1 and the second unit pixel circuits PC2 may be disposed in the first partial area P1 so as to be spaced from each other by a regular interval. The second light emitting devices LD2 may be disposed in the second partial area P2 in the same arrangement as the first light emitting devices LD1 of the first partial area P1. The second light emitting device LD2 of the second partial area P2 may be connected with the second unit pixel circuits PC2 adjacent thereto. Depending on the arrangement, the second light emitting device LD2 may be connected with one of the first unit pixel circuits PC1 adjacent thereto.

The first unit pixel circuits PC1 disposed in the first partial area P1 along the first direction DR1 may be connected by scan lines SSL extending in the first direction DR1. The second unit pixel circuits PC2 disposed in the first partial area P1 along the first direction DR1 may be connected by the scan lines SSL extending in the first direction DR1. The scan lines SSL may be connected with the first to seventh transistors T1 to T7 (refer to FIG. 11) of the first unit pixel circuits PC1 and the second unit pixel circuits PC2 to supply the scan lines GWi, GCi, GIi, and GWi+1 (refer to FIG. 11). The scan lines SSL may overlap the first partial area P1 and may not overlap the second partial area P2. The number of scan lines SSL illustrated in FIG. 21 is provided only as an example, and if necessary, the number of scan lines SSL may be variously changed.

The first unit pixel circuits PC1 and the second unit pixel circuits PC2 disposed in the first partial area P1 may extend in the second direction DR2 and may be connected by the data lines DL intersecting the scan lines SSL when viewed from above a plane. The data lines DL may be connected with the first to seventh transistors T1 to T7 (refer to FIG. 11) of the first unit pixel circuits PC1 and the second unit pixel circuits PC2 to supply the data signals Dj (refer to FIG. 11). The data lines DL may extend in the second direction DR2, and the data lines DL may partially overlap the second partial area P2.

An interval PP1 between light emitting devices adjacent along the second direction DR2 may be greater than an interval PP2 between pixel circuits adjacent along the second direction DR2. As such, the pixel circuits present only in the first partial area P1 may respectively transfer signals to the light emitting devices present in the first partial area P1 and the second partial area P2.

Figure 22:
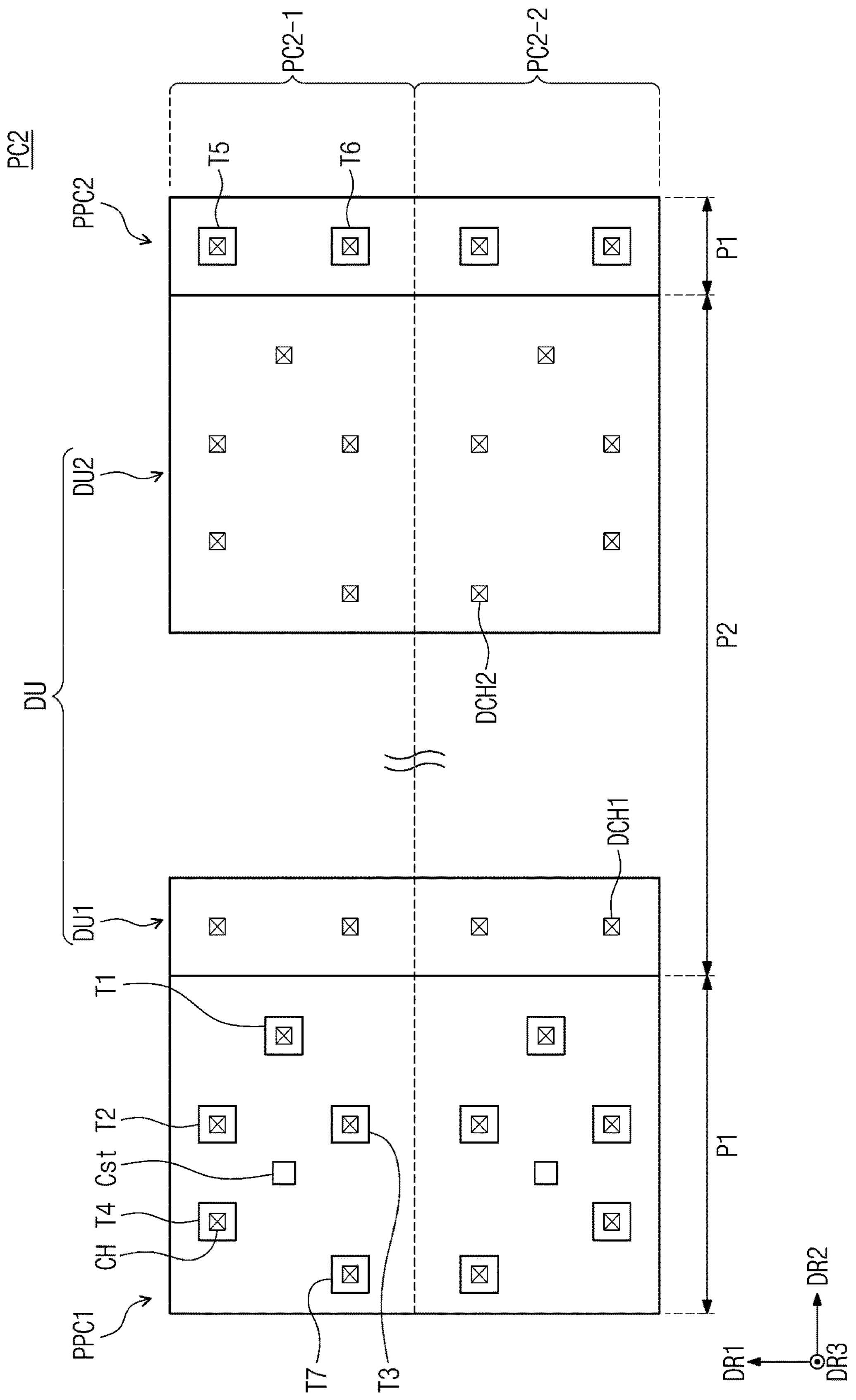
FIG. 22 is a schematic plan view illustrating a dummy area according to an embodiment.

FIG. 22 is a schematic plan view illustrating a dummy area DU according to an embodiment. Referring to FIG. 22, the second partial area P2 may include the dummy area DU. The dummy area DU may include a first dummy area DU1 and a second dummy area DU2.

The first dummy area DU1 may be adjacent to the first partial circuit PPC1. First dummy contact holes DCH1 disposed at locations corresponding to the contact holes CH of the second partial circuit PPC2 may be defined in the first dummy area DU1. The area occupied by the first dummy area DU1 in a plan view may be substantially the same as the area occupied by the second partial circuit PPC2 in a plan view.

In the case of combining the first dummy area DU1 and the first partial circuit PPC1, a contact hole arrangement of the combination may be the same arrangement as the contact holes CH of the first unit pixel circuit PC1. That is, the first dummy contact holes DCH1 of the first dummy area DU1 may perform a role of the contact holes CH of the second partial circuit PPC2. As such, it may be possible to reduce a contact hole density difference between circuits, which is caused as the second unit pixel circuit PC2 is divided into the first partial circuit PPC1 and the second partial circuit PPC2. Accordingly, there may be no issue that a device characteristic of the second unit pixel circuit PC2 is different from that of the first unit pixel circuit PC1 not divided into partial circuits. Also, uniformity may be implemented in the process of forming a pixel circuit, such as a dry etching process.

The second dummy area DU2 may be adjacent to the second partial circuit PPC2. Second dummy contact holes DCH2 disposed at locations corresponding to the contact holes CH of the first partial circuit PPC1 may be defined in the second dummy area DU2. The area occupied by the second dummy area DU2 in a plan view may be substantially the same as the area occupied by the first partial circuit PPC1 in a plan view.

In the case of combining the second dummy area DU2 and the second partial circuit PPC2, a contact hole arrangement of the combination may be the same arrangement as the contact holes CH of the first unit pixel circuit PC1. That is, the second dummy contact holes DCH2 of the second dummy area DU2 may perform a role of the contact holes CH of the first partial circuit PPC1.

According to the disclosure, a pixel circuit is not disposed in an area corresponding to an opening of a support plate of a display panel. As such, a defect that a pixel circuit is short-circuited or opened by the external impact may decrease.

According to the disclosure, as one pixel circuit is divided and disposed into circuits, with an opening part interposed therebetween, the design of a folding area or a rolling area may be freer.

While the disclosure has been described with reference to embodiments thereof, it will be apparent to those of ordinary skill in the art that various changes and modifications may be made thereto without departing from the spirit and scope and as set forth in the following claims.

What is claimed is:

1. A display device comprising:

a support plate including a first area and a second area; and a display panel including a first display area overlapping the first area in plan view and a second display area overlapping the second area in plan view, wherein the second area includes openings and a support area adjacent to the openings, a shape of the second area is configured to change as an operation mode of the display device switches, the second display area includes:

a first partial area including a pixel circuit of a first group, a pixel circuit of a second group, and a first light emitting device electrically connected to the pixel circuit of the first group or the pixel circuit of the second group and overlapping the support area in a plan view; and second partial areas each including a second light emitting device electrically connected to the pixel circuit of the first group or the pixel circuit of the second group and respectively overlapping the openings in plan view, the pixel circuit of the second group includes a first partial circuit and a second partial circuit, and a corresponding second partial area among the second partial areas and the second light emitting device respectively disposed in the second partial area are both disposed between the first partial circuit and the second partial circuit in a plan view.

2. The display device of claim 1, wherein the first area has a substantially flat support surface.

3. The display device of claim 1, further comprising a plurality of first light emitting devices disposed in the first partial area and including the first light emitting device, and a plurality of second light emitting devices disposed in the second partial areas including the second light emitting device, wherein a resolution of the first light emitting devices is substantially identical to a resolution of the second light emitting devices.

4. The display device of claim 1, wherein the first display area includes a plurality of third light emitting devices, and a resolution of a light emitting devices of the first display area is substantially identical to a resolution of a light emitting devices of the second display area.

5. The display device of claim 4, wherein the resolution of the light emitting devices of the first display area and the resolution of the light emitting devices of the second display area are less than a resolution of pixel circuits of the first partial area.

6. The display device of claim 1, wherein the first display area includes a plurality of third light emitting devices and a pixel circuit of a third group electrically connected to at least one of the third light emitting devices, and a resolution of pixel circuits of the first display area is less than a resolution of pixel circuits of the first partial area of the second display area.

7. The display device of claim 1, wherein the first area includes first areas, and the second area is disposed between two first areas adjacent to each other from among the first areas.

8. The display device of claim 1, wherein the pixel circuit of the second group includes a first transistor, a second transistor, a third transistor, a fourth transistor, a fifth transistor, a sixth transistor, and a seventh transistor and a capacitor, and contact holes are defined in the display panel to correspond to the first transistor, the second transistor, the third transistor, the fourth transistor, the fifth transistor, the sixth transistor and the seventh transistor.

9. The display device of claim 8, wherein at least part of the first transistor, the second transistor, the third transistor, the fourth transistor, the fifth transistor, the sixth transistor and the seventh transistor and at least part of the contact holes are disposed in the first partial circuit, and remaining transistors of the first transistor, the second transistor, the third transistor, the fourth transistor, the fifth transistor, the sixth transistor and the seventh transistor and remaining contact holes of the contact holes are disposed in the second partial circuit.

10. The display device of claim 9, wherein first dummy contact holes corresponding to locations of the remaining contact holes of the contact holes are defined in the second partial area adjacent to the first partial circuit.

11. The display device of claim 9, wherein second dummy contact holes corresponding to locations of the some of the contact holes are defined in the second partial area adjacent to the second partial circuit.

12. The display device of claim 1, wherein the support area is in a substantially lattice shape.

13. The display device of claim 1, wherein the pixel circuit of the second group includes pixel circuits, and the pixel circuits includes:

a (2-1)-th pixel circuit electrically connected to a corresponding light emitting device among the first light emitting device and the second light emitting device; and a (2-2)-th pixel circuit electrically connected to a corresponding light emitting device among the first light emitting device and the second light emitting device.

14. The display device of claim 13, wherein the first partial circuit and the second partial circuit are spaced from each other in a first direction, with the corresponding second partial area disposed between the first partial circuit and the second partial circuit, and the (2-1)-th pixel circuit and the (2-2)-th pixel circuit are substantially symmetric with respect to the first direction.

15. The display device of claim 1, wherein a pixel circuit is not disposed in the second partial area.

16. The display device of claim 1, wherein the second area is unfolded in a first mode and is folded or rolled in a second mode.

17. The display device of claim 1, wherein the display panel further includes connection lines electrically connecting the first partial circuit and the second partial circuit, and at least part of the connection lines overlap corresponding openings among the openings in plan view.

18. The display device of claim 1, wherein the display panel further includes a scan line supplying a scan signal to the pixel circuit of the first group and the pixel circuit of the second group, and the scan line overlaps the support area in plan view.

19. The display device of claim 18, further comprising:

a data line intersecting the scan line in a plan view and supplying a data signal to the pixel circuit of the first group and the pixel circuit of the second group, and wherein a portion of the data line overlaps a corresponding opening among the openings in plan view.

20. An electronic device comprising:

a display device, an electronic module, and a power module, the display device comprising:

a display panel including a first area and a second area, wherein a shape of the first area is configured not to change as an operation mode of the display device switches, a shape of the second area is configured to change as an operation mode of the display device switches, the second area includes:

a first partial area including a pixel circuit of a first group, a pixel circuit of a second group, and a first light emitting device electrically connected to the pixel circuit of the first group or the pixel circuit of the second group; and a second partial area including a second light emitting device electrically connected to the pixel circuit of the first group or the pixel circuit of the second group, the pixel circuit of the second group includes a first partial circuit and a second partial circuit disposed in an area and an opposite area of the first partial area, with the second partial area and the second light emitting device of the second partial area disposed between the first partial circuit and the second partial circuit in a plan view, and the first partial circuit and the second partial circuit are electrically connected by a connection line intersecting the second partial area.

* * * * *